United States Patent
Taguchi et al.

(10) Patent No.: US 9,514,528 B2
(45) Date of Patent: Dec. 6, 2016

(54) IMAGE PROCESSING APPARATUS, DISTORTION-CORRECTED MAP CREATION APPARATUS, AND SEMICONDUCTOR MEASUREMENT APPARATUS

(71) Applicant: Hitachi High-Technologies Corporation, Tokyo (JP)

(72) Inventors: Junichi Taguchi, Tokyo (JP); Mitsuji Ikeda, Tokyo (JP); Yuichi Abe, Tokyo (JP); Osamu Inoue, Tokyo (JP); Takahiro Kawasaki, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 208 days.

(21) Appl. No.: 14/370,360

(22) PCT Filed: Oct. 3, 2012

(86) PCT No.: PCT/JP2012/075622
§ 371 (c)(1),
(2) Date: Jul. 2, 2014

(87) PCT Pub. No.: WO2013/114675
PCT Pub. Date: Aug. 8, 2013

(65) Prior Publication Data
US 2014/0341461 A1    Nov. 20, 2014

(30) Foreign Application Priority Data

Jan. 31, 2012    (JP) .................................. 2012-019247

(51) Int. Cl.
*G06T 5/00*    (2006.01)
*G06T 5/20*    (2006.01)
(Continued)

(52) U.S. Cl.
CPC ........... *G06T 7/0004* (2013.01); *G01R 31/311* (2013.01); *G06T 3/4007* (2013.01); *G06T 5/006* (2013.01);
(Continued)

(58) Field of Classification Search
CPC ...... G01R 31/311; G06T 3/4007; G06T 5/006; G06T 5/20; G06T 7/004; G06T 2207/20056; G06T 2207/20182; G06T 2207/30148; H04N 1/387; H04N 1/3878
See application file for complete search history.

(56) References Cited

U.S. PATENT DOCUMENTS 4,908,573 A    3/1990  Kaufman et al.
5,384,648 A *  1/1995  Seidner ................. G06T 3/4007
                                                    358/525
(Continued)

FOREIGN PATENT DOCUMENTS

JP    2-191079    7/1990
JP    11-194154   7/1999
(Continued)

OTHER PUBLICATIONS

Takita et al., "A Sub-Pixel Correspondence Search Technique for Computer Vision Applications," IEICR Trans. Fundamentals, Aug. 2004, vol. E87, No. 8, pp. 1913-1923.
(Continued)

*Primary Examiner* — Yubin Hung
(74) *Attorney, Agent, or Firm* — Foley & Lardner LLP

(57) ABSTRACT

Image processing apparatus includes: interpolation process image acquisition means for acquiring an interpolation process image of prescribed size which includes an interpolation point of an inputted image; Fourier transform means for subjecting the interpolation process image which is acquired with the interpolation process image acquisition means to (Continued)

Fourier transform; phase change means for changing, a phase of each value of the transformed interpolation process image which has been subjected to Fourier transform by the Fourier transform means, such that the interpolation point migrates to a desired nearby integer coordinate position; inverse Fourier transform means for subjecting the interpolation process image whose phase has been changed by the phase change means, to inverse Fourier transform; interpolation value determination means for adopting an interpolation point, a value of a pixel at the integer coordinate position, from the transformed interpolation process image subjected to inverse Fourier transform by the inverse Fourier transform means.

9 Claims, 16 Drawing Sheets

(51) Int. Cl.
*G06T 7/00* (2006.01)
*H04N 1/387* (2006.01)
*G06T 3/40* (2006.01)
*G01R 31/311* (2006.01)

(52) U.S. Cl.
CPC ............... *G06T 5/20* (2013.01); *H04N 1/387* (2013.01); *H04N 1/3878* (2013.01); *G06T 2207/20056* (2013.01); *G06T 2207/20182* (2013.01); *G06T 2207/30148* (2013.01)

(56) References Cited

U.S. PATENT DOCUMENTS

| | | | | |
|---|---|---|---|---|
| 6,685,641 | B2* | 2/2004 | Liu | G01S 7/52028 600/443 |
| 6,687,422 | B1* | 2/2004 | Chen | G06T 3/4084 345/606 |
| 2004/0086170 | A1 | 5/2004 | Shishido et al. | |
| 2005/0180650 | A1* | 8/2005 | Komagamine | G06T 5/006 382/254 |
| 2006/0173319 | A1* | 8/2006 | Sumi | A61B 8/08 600/437 |
| 2006/0188172 | A1* | 8/2006 | Higurashi | G06T 5/006 382/275 |
| 2006/0241429 | A1* | 10/2006 | Ustuner | G10K 11/346 600/437 |
| 2007/0216802 | A1 | 9/2007 | Kondo et al. | |
| 2008/0151308 | A1 | 6/2008 | Frei | |
| 2010/0135595 | A1* | 6/2010 | Du | G06K 9/32 382/275 |
| 2012/0114262 | A1* | 5/2012 | Yu | G06T 5/006 382/254 |
| 2013/0016918 | A1* | 1/2013 | Haribhatt | G06T 5/006 382/275 |

FOREIGN PATENT DOCUMENTS

| | | |
|---|---|---|
| JP | 2007-251688 A | 9/2007 |
| JP | 2007-538436 A | 12/2007 |

OTHER PUBLICATIONS

Distortion Correction Technology of Fisheye Lens; Hitachi Information & Telecommunication Engineering, Ltd.; Retrieved on Nov. 8, 2011 from the Internet: <URL: http://www.hitachi-jten.co.jp/products/fisheye/index.html>; pp. 1-17.

Makita, Goshi; Study on Unidirectional Expansion of Fisheye Image and Its Application; Tokyo City University; Retrieved on Nov. 8, 2011 from the Internet: <URL: http://athena.vm.cs.tcu.ac.jp>: pp. 1-5.

Interpolation; Wikipedia; Retrieved on Mar. 5, 2014 from the Internet: <URL: http://en.wikipedia.org/wiki/Interpolation; pp. 1-6.

PCT International Search Report on application PCT/JP2012/075622 mailed Dec. 25, 2012; 2 pages.

* cited by examiner

IMAGE PROCESSING APPARATUS, DISTORTION-CORRECTED MAP CREATION APPARATUS, AND SEMICONDUCTOR MEASUREMENT APPARATUS

TECHNICAL FIELD

The present invention relates to an image processing technique and, particularly, to a process for interpolating a pixel value when correcting an image.

BACKGROUND ART

Techniques for subjecting an image to desired deformation are conventionally known. For example, when correcting a distortion of an image created by photography, a process for deforming the image is performed. For example, NPL1 describes a technique for correcting a distortion of an image photographed using a fisheye lens. In addition, NPL2 presents an example of a method of correcting a distortion created by a fisheye lens. Various other image deformation processes are available including an image deformation process for correcting a distortion of an image created by the lens of a camera and a process for performing geometric correction on a photographed image in order to superimpose the image on a map.

Such image deformation processes geometrically associate respective pixels in an image after correction to positions in the image prior to correction. There are various correspondence models and distortion measurement methods used for image deformation processes according to characteristics of a photographic system or a distortion.

When a position in an image prior to correction to which a pixel after correction is associated exactly overlaps a position of a discretely existing pixel, a pixel value of the image prior to correction can be applied without modification to a pixel value of the image after correction. However, generally, a position to which a pixel after correction is associated by geometrical correspondence does not overlap with a position of a pixel in the image prior to correction and falls on a midway position between pixels. Therefore, a pixel value of a pixel after correction is obtained by an interpolating process from a pixel value of a pixel in a vicinity of the midway position.

Various methods are being proposed as interpolation processing methods. For example, NPL3 describes several interpolation methods.

Typical examples of interpolation methods include three methods known as "nearest neighbor interpolation", "linear interpolation", and "cubic interpolation". Among the three methods, "cubic interpolation" achieves the highest accuracy. An interpolation method capable of achieving even higher accuracy is called Lanczos-n interpolation.

In addition, a phase restriction correlation method described in NPL4 is available as a method of evaluating accuracy of an image deformation process such as distortion correction involving an interpolation process. With the phase restriction correlation method, a deviation of an image after deformation from an original image can be measured to an accuracy of a level of subpixels that represent a fine division of a space between pixels.

CITATION LIST

Non Patent Literature

[NPL1]
  "Distortion correction technology of fisheye lens", Hitachi Information & Telecommunication Engineering, Ltd., retrieved Nov. 8, 2011 URL http://www.hitachi-jten.co.jp/products/fisheye/index.html
[NPL 2]
  Goshi Makita, "Study on unidirectional expansion of fisheye image and its application", Bao Laboratory, Tokyo City University, retrieved Nov. 8, 2011 URL http://athena.vm.cs.tcu.ac.jp
[NPL 3]
  "Interpolation", WIKIPEDIA The Free Encyclopedia URL http://ja.wikipedia.org/wiki/ %E5%86%85%E6%8C% BF
[NPL 4]
  Kenji TAKITA, etc., "A Sub-Pixel Correspondence Search Technique for Computer Vision Applications", IEICE TRANS. FUNDAMENTALS, VOL.E 87-A, NO. 8, pp. 1913- 1922, AUGUST 2004.

SUMMARY OF INVENTION

Technical Problem

However, when an image is simply translated without deforming the image while performing interpolation of pixel values by an interpolation method typified by the three methods described earlier and the original image is compared with an image obtained by the translation, a measurement of a migration amount results in the detection of an error of around 0.04 pixels even in the case of cubic interpolation that achieves relatively high accuracy. In addition, even in the case of Lanczos-8 interpolation that references 16*16 neighboring pixels, an error of around 0.015 pixels is created when interpolating a single pixel.

An error of 0.01 pixels or less in measurement using the phase restriction correlation method is considered as a target with respect to allowable accuracy. However, with conventional methods such as those described above, the error as measured by the phase restriction correlation method cannot be reduced to 0.01 pixels or less.

An object of the present invention is to provide a technique for reducing an error between an original image and an image after correction without including the number of neighboring pixels to be used to interpolate a pixel.

Another object of the present invention is to provide a technique for creating a distortion-corrected map for obtaining, at high accuracy, a position of an interpolation point when correcting a distorted image.

Solution to Problem

An image processing apparatus according to an embodiment of the present invention includes: interpolation process image acquisition means for acquiring an interpolation process image of a prescribed size which includes an interpolation point of an inputted image; Fourier transform means for subjecting the interpolation process image which is acquired with the interpolation process image acquisition means to Fourier transform; phase change means for changing, based on a shift theorem, a phase of each value of the transformed interpolation process image which has been subjected to Fourier transform by the Fourier transform means, such that the interpolation point migrates to a desired nearby integer coordinate position; inverse Fourier transform means for subjecting the interpolation process image whose phase has been changed by the phase change means, to inverse Fourier transform; and interpolation value determination means for adopting, as an interpolation value of the interpolation point, a value of a pixel at the integer coordinate position, from the transformed interpolation process image which has been subjected to inverse Fourier transform by the inverse Fourier transform means.

An image processing apparatus according to another aspect of the present invention includes: reference data retention means for retaining data created by subjecting one-dimensional data of a prescribed length to Fourier transform, as reference data; interpolation process image acquisition means for acquiring an interpolation process image of a prescribed size which includes an interpolation point of an inputted image; weighted image creation means for creating a weighted image of a same size as the interpolation process image by determining a reference position on the basis of a distance between the interpolation point and a desired integer coordinate position in a vicinity of the interpolation point and acquiring data from the reference position of the reference data; and product sum calculation means for adopting a product sum of the interpolation process image and the weighted image as an interpolation value of the interpolation point.

An image processing apparatus according to yet another aspect of the present invention includes: interpolation value calculation means for calculating an interpolation value of an interpolation point of an inputted image based on a prescribed interpolation method which uses a distance between the interpolation point and an integer coordinate position in a vicinity of the interpolation point as a parameter value; translated image creation means for creating a translated image by defining an interpolation point by configuring a desired assumed migration amount as a parameter value of the interpolation value calculation means and having the interpolation value calculation means perform an interpolation process on the inputted image; migration amount measurement means for measuring a measured migration amount from the inputted image with respect to the translated image created by the translated image creation means; correspondence creation means for determining correspondence information that enables obtaining a corrected migration amount to be configured as the parameter value in order to obtain an interpolation value of an interpolation point of an actual migration amount, from the actual migration amount on the basis of a relationship between the assumed migration amount and the measured migration amount measured by the migration amount measurement means with respect to the translated image; and corrected interpolation value calculation means for determining, based on the correspondence information, a corrected migration amount obtained when a distance between an interpolation point of the inputted image and an integer coordinate position in a vicinity of the interpolation point is adopted as an actual migration amount, and performing an interpolation process on the inputted image by configuring the corrected migration amount as a parameter value and by using the interpolation method.

A distortion-corrected map creation apparatus according to an aspect of the present invention is a distortion-corrected map creation apparatus performing a process of creating a distortion-corrected map from a distortion map, the distortion map being a map showing a point from which each point on a distorted image had originally migrated due to the distortion, and the distortion-corrected map being a map showing where each point on an image without the distortion migrates due to the distortion, the distortion-corrected map creation apparatus including: original coordinate calculation means for referencing a value of the distortion map with respect to four adjacent points of interest on the distortion map and calculating coordinates of a migration source of the four points prior to migration due to the distortion; interior point candidate calculation means for adopting, as an interior point candidate, an integer coordinate value within a first square that is enclosed by a maximum value and a minimum value in an x direction and a maximum value and a minimum value in a y direction among coordinates of four migration source points; interior point determination means for determining the interior point candidate as an interior point when the interior point candidate is inside or on a side of a second square that is formed by the four migration source points; proportional position calculation means for calculating and determining, with respect to the interior point, a proportional position of the interior point in the second square to a prescribed accuracy; and distortion-corrected map value calculation means for calculating a value of the distortion-corrected map at the interior point position on the basis of the proportional position.

BRIEF DESCRIPTION OF DRAWINGS

FIG. 12 is a diagram showing a distortion-corrected map 204, an interpolation point 421, and the like.

DESCRIPTION OF EMBODIMENTS

Figure 1:
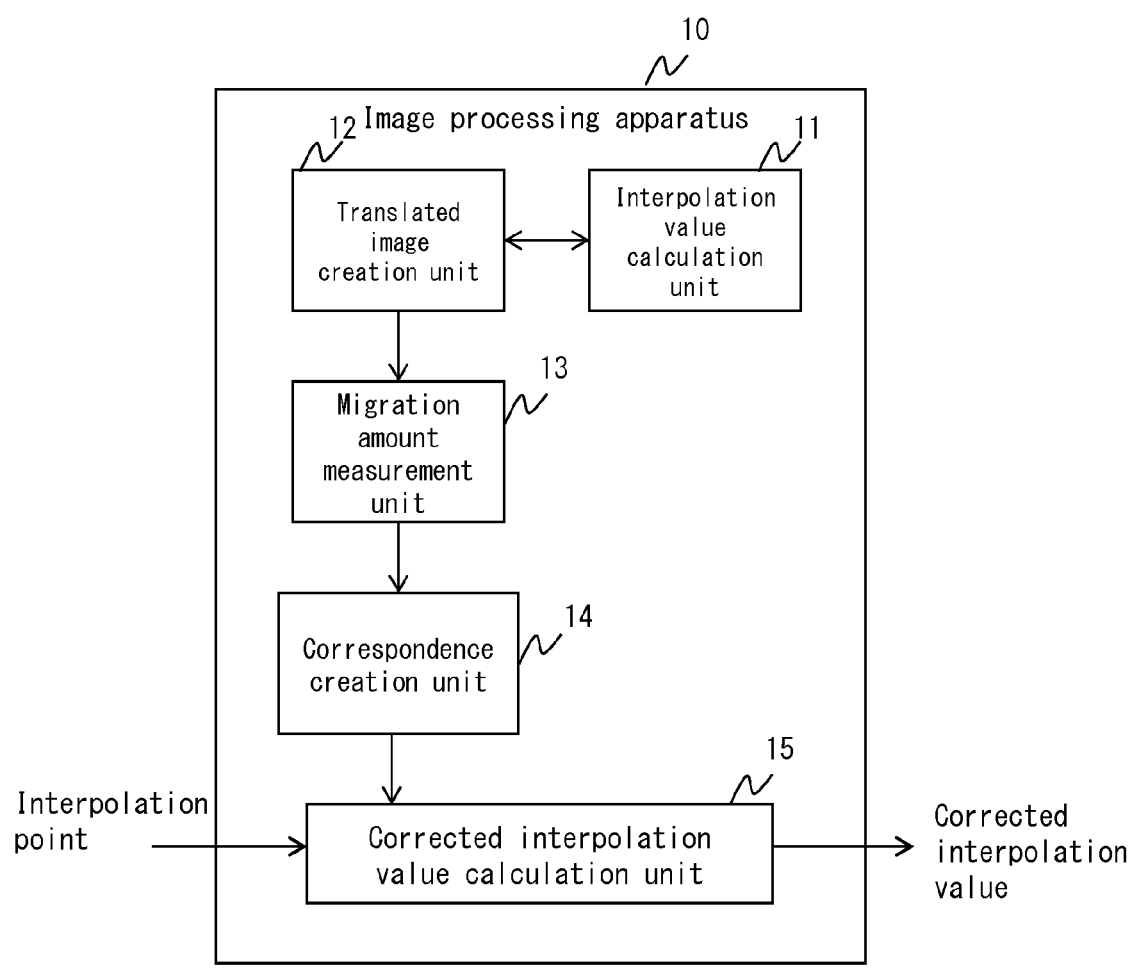
FIG. 1 is a block diagram showing a functional configuration of an image processing apparatus according to a first embodiment.

A description of various processes that are used in the present embodiment will be given before describing configurations and operations according to embodiments of the present invention.
(First Process)

A first process is a process involving subjecting an interpolation point and n*n number of neighboring pixels thereof to FFT (fast Fourier transform), performing a phase change based on the shift theorem, performing inverse FFT, and performing interpolation by adopting a value of a center point as a value of the interpolation point. An interpolation point refers to a point to be interpolated using pixel values of neighboring pixels. A procedure of the interpolation can be described with mathematical expressions as follows.

Let (x, y) denote a position of an interpolation point of interest. Generally, x, y are not integers. In (x, y)=(x0+dx, y0+dy), it is assumed that x0, y0 are integer values and dx, dy are real values such that $-0.5 \leq dx < 0.5$, $-0.5 \leq dy < 0.5$. Thus, x, y can be separated into an integer coordinate value (x0, y0) and a decimal coordinate value (dx, dy). A first interpolation method is performed based on mathematical expression (1) below.
[Math. 1]

$$G2 = F^{-1} \cdot S(-dx, -dy) \cdot F \cdot G \tag{1}$$

where G denotes an image constituted by n*n number of neighboring pixels of the interpolation point. F denotes an operator for subjecting an image to two-dimensional Fourier transform. S(−dx, −dy) denotes an operator for performing a phase change that causes a migration of (−dx, −dy) based on the shift theorem of Fourier transform which states that a translation in a spatial area is equivalent to a linear phase shift in a Fourier area. $F^{-1}$ denotes an operator for performing two-dimensional inverse Fourier transform. G2 denotes an image after transform. A value of an interpolation point to be determined is a value of a center position of G2.

G represents a result of creating an n*n image by adopting the integer coordinate (x0, y0) of the interpolation point of interest as a center (n/2, n/2) of the n*n image and arranging neighboring pixels thereof. For example, when n=16, an image is presented by pixels with brightness values at integer coordinates from (0, 0) to (15, 15) and a center coordinate is (8, 8). F denotes two-dimensional Fourier transform. FFT (fast Fourier transform) can be used when n is a power of an integer such as a power of 2 or a power of 3. The same applies to $F^{-1}$.

As for a specific operation of S(−dx, −dy), the calculations of mathematical expressions (2) to (4) below are performed for each point (a, b) of the image.
[Math. 2]

$$\theta(a,b) = dx*(((a+(n/2))\% n) - (n/2)) + dy*(((b+(n/2))\% n) - (n/2)) + dy*(((b+(n/2))\% n) - (n/2)); \tag{2}$$

[Math. 3]

$$C(a,b) = \cos(\theta(a,b)) + i \cdot \sin(\theta(a,b)); \tag{3}$$

[Math. 4]

$$H2(a,b) * H(a,b) * C(a,b) \tag{4}$$

[Math. 5]

$$H = F \cdot G \tag{5}$$

However, as shown in mathematical expression (5) H denotes an image resulting from a two-dimensional Fourier transform of G. H(a, b) denotes a value at coordinate (a, b) in the image H. C(a, b) is a complex representation of a phase change based on the shift theorem at coordinate (a, b). θ(a, b) denotes a phase change amount based on the shift theorem at coordinate (a, b). Accordingly, a migration of (−dx, −dy) takes place in real space. Alternatively, as for θ(a, b) in mathematical expression (2), ((a+(n/2))% n)−(n/2) may be replaced by just a and ((b+(n/2))% n)−(n/2) may be replaced by just b.

Moreover, the value of the interpolation point to be determined is the value at the center position of G2 or, in other words, a value of G2(n/2, n/2).

By creating a translated image with an interpolation method that involves cutting out a partial image of 16*16 pixels using the first process described above, an error as measured by the phase restriction correlation method can be reduced. Specifically, high accuracy of around 0.008 pixels is achieved with respect to an error as measured by the phase restriction correlation method. An error when performing Lanczos-8 interpolation using the same 16*16 pixels of the partial image is around 0.015 pixels. Therefore, with the first process, a translated image can be created at good migration accuracy that is around twice the accuracy of Lanczos-8 interpolation.
(Second Process)

A second process is a process involving subjecting an interpolation point to interpolation by performing a weighted product sum calculation based on a convolution that is mathematically equivalent to the first process. However, since an accurate equivalent calculation of a product sum is a time-consuming operation, a table of weights calculated with respect to prescribed one-dimensional discrete migration amounts is created in advance and a weight is approximately calculated using the table. Once a weight is calculated, an interpolation calculation is performed according to mathematical expression (6) below.
[Math. 6]

$$g3 = (\Sigma ab W(a,b) \cdot G(a,b))/(\Sigma ab W(a,b)) \tag{6}$$

where Σab denotes calculating a sum for $0 \leq a < n$ and $0 \leq b < n$, and W(a, b) denotes a weight. G is the same as that described for the first process. g3 denotes a value of an interpolation point to be calculated. When calculation errors of tabulation or the like are to be ignored, g3 equals G2(n/2, n/2) described in the first process.

The weight W(a, b) is calculated from table T comprising (n+2)*m entries, where m denotes an integer.

As shown in mathematical expression (7) below, the tables T is created by creating n*m pieces of rectangular data data and subjecting the rectangular data data to one-dimensional Fourier transform as shown in mathematical expression (8). When n*m is a power of an integer such as a power of 2, FFT can be performed as the Fourier transform. In addition, while rectangular data data is used in this case as shown in mathematical expression (7), the present invention is not limited thereto. Alternatively, for example, data with a shape similar to a rectangle may be used instead of data that is a perfect rectangle.

[Math. 7]

$$\text{data}(t) = 0; \text{ (where } t \text{ is an integer satisfying } n/2 <= t < n*m - n/2) \quad (7)$$
$$= 1; \text{ (where } 0 <= t < n/2 \text{ or } n*m - n/2 <= t < n*m)$$

[Math. 8]

$$T(u) = (F\text{data}((u + (n/2 - 1)*m)\%(n*m)) \quad (8)$$
(where $u$ is an integer satisfying $0 <= u < (n + 2)*m$)

wherein Fdata is a Fourier transform of the data(t) defined in Math. 7.

Moreover, % denotes an operation for calculating a remainder of a division. A center point of a table T created according to mathematical expression (8) is calculated as $T((n/2+1)*m) = F\text{data}(0)$, which corresponds to a 0 frequency point of data subjected to Fourier transform. Since data is created as shown in mathematical expression (7), T may be described as being a table created at a segmentation accuracy of 1/m. For example, if m=256, then data for interpolation may be described as being created at an accuracy of 1/256 pixels.

A weight w(a, b) in case of an interpolation point (x, y)=(x0+dx, y0+dy) (where x0, y0 are integers and dx, dy are real numbers satisfying $-0.5<=dx<0.5$, $-0.5<=dy<0.5$) is created according to mathematical expressions (9) to (15) below.

[Math. 9]

$$a1 = (int)((a+1+dx)*m) \text{ (where } a \text{ is an integer satisfying } 0<=a<n) \quad (9)$$

[Math. 10]

$$a2(a+1+dx)*m)-a1 \quad (0<=a<n) \quad (10)$$

[Math. 11]

$$b1 = (int)((b+1+dy)*m) \text{ (where } b \text{ is an integer satisfying } 0<=b<n) \quad (11)$$

[Math. 12]

$$b2 = ((b+1+dy)*m)-b1 \quad (0<=b<n) \quad (12)$$

[Math. 13]

$$W(a) = ((1-a2) \cdot T(a1) + a2 \cdot T(a1+1)) \quad (0<=a<n) \quad (13)$$

[Math. 14]

$$W(b) = ((1--b2) \cdot T(b1) + b2 \cdot T(b1+1)) \quad (0<==b<n) \quad (14)$$

[Math. 15]

$$W(a,b) = W(a) \cdot W(b) \quad (0<=a<n, 0<=b<n) \quad (15)$$

By creating a translated image with an interpolation method in which a partial image of 16*16 pixels is cut out using the second process described above, high accuracy of around 0.008 pixels is achieved as an error as measured by the phase restriction correlation method in a comparable manner to the first process.

(Third Process)

A third process is an interpolation process for further improving migration accuracy of translation when translation is performed by interpolation according to an interpolation method based on the first and second processes or the like.

As described earlier in the first process, a coordinate (x, y) is divided into an integer coordinate value (x0, y0) and a decimal coordinate value (dx, dy), where (x, y)=(x0+dx, y0+dy), $-0.5<=dx<0.5$, and $-0.5<=dy<0.5$. At this point, when an image is created by setting (x0, y0) as an interpolation value of an interpolation point (x, y) for all points in the image, an image interpolated at high accuracy with respect to translation is an image translated from an original image by precisely (−dx, −dy). However, an actual measurement of a translation amount using the phase restriction correlation method does not result in a measured migration amount value of (−dx, −dy) and contains an error. For example, let us assume that a measurement value of a translation amount according to the phase restriction correlation method is (−dx_me, −dy_me). In this case, by interpolating a point with a deviation of (dx, dy) by prescribed interpolation, the actual translation amount can be regarded as (−dx_me, −dy_me).

In a similar manner, there must be a corrected interpolation point (x0+dx_h, y0+dy_h) whose actual migration amount is (−dx, −dy). In other words, when calculating a corrected interpolation value of (x0+dx_h, y0+dy_h), the third process is an interpolation method involving calculating an interpolation value of the corrected interpolation point (x0+dx_h, y0+dy_h) using a prescribed interpolation method and adopting the value as an interpolation value due to a new migration correction of the interpolation point (x0+dx, y0+dy).

Association of the interpolation point (x0+dx, y0+dy) with the migration amount-corrected interpolation point (x0+dx_h, y0+dy_h) is performed based on a measured value of a migration amount of a translated image created by interpolation using a prescribed interpolation method. The measurement of a migration amount can be performed according to the phase restriction correlation method or the like. Due to the measurement, an association unique to an original interpolation method is performed from a measured value. For example, when the original interpolation method is the interpolation method according to the first process, a migration amount of an image translated using the first interpolation method is measured and association is performed so that a position of an interpolation point can be corrected based on the measured value. In addition, when the original interpolation method is an interpolation method according to cubic interpolation, a migration amount of an image translated using cubic interpolation is measured and association is performed so that a position of an interpolation point can be corrected based on the measured value.

Moreover, a measured value of a translation amount of a translated image as measured by the phase restriction correlation method contains an error that differs according to the image. In consideration thereof, a plurality of representative images may be selected and an average value of measured values of translation amounts may be calculated.

Since all real number translation amounts cannot be measured by performing translation in minute units, measurements are performed by providing discrete translation amounts and a table of measurement values is created and used.

For example, when a minute migration amount ds such that ds=1/ms (where ms is an integer) is assumed, a migration amount s having discrete values between 0 and 1 is defined as shown in mathematical expression (16) below.
[Math. 16]

$$s = ks \cdot ds \text{ (where } ks \text{ is an integer satisfying } 0 <= ks <= ms) \quad (16)$$

Let us assume that a migration amount of an image subjected to translation which interpolates an interpolation point (x0−s, y0) by a prescribed interpolation method to (x0, y0) is measured using the phase restriction correlation method and that a migration amount in an x direction is s_me. In other words, a measured migration amount of a translation that is considered a migration amount s in a prescribed interpolation method is s_me. In this case, this will be described as a measured migration amount corresponding to an assumed migration amount s by a prescribed interpolation method being s_me. Alternatively, this can also be described as a corrected migration amount of an interpolation that provides an actual migration amount of s_me being s.

Since measurements contain measurement errors, the number of measurement points can be increased and an average thereof can be calculated in order to reduce such measurement errors. For example, let us assume that a migration amount of an image subjected to translation which interpolates an interpolation point (x0−ds, y0−ds) by a prescribed interpolation method to (x0, y0) is measured using the phase restriction correlation method and that a migration amount in an x direction is s_mex and a migration amount in a y direction is s_mey. In this case, an average expressed as (s_mex+s_mey)/2 can be adopted as a measured migration amount with respect to an assumed migration amount s.

As described above, an image translated by an assumed migration amount of respective ks in mathematical expression (16) is created and a measured migration amount is determined by measuring a migration amount. The determined measured migration amount is assumed to be a value ST1(ks) corresponding to ks in a migration amount measurement table ST1.

A monotonically increasing function is expected where the migration amount measurement table ST1(0) is 0 and the migration amount measurement table ST1(ms) is 1. Since measurement values are likely to contain errors, when an increase is not monotonic, a suitable filter is favorably applied so that monotonic increase is realized. In addition, favorably, when ST1(ms) is not 1, by setting ST1(ms) to 1 and changing those exceeding 1 among ST1(ks) to 1, the monotonic increase of the migration amount measurement table ST1 is maintained.

Once the migration amount measurement table ST1 is created as described above, by performing inter-table interpolation, a measured migration amount expectation value u_ex can be calculated as shown in mathematical expression (18) with respect to a general assumed migration amount u as shown in mathematical expression (17).
[Math. 17]

$$u = ku \cdot ds + au \quad (17)$$

(where ku is an integer satisfying 0<=ku<=ms),
(au is a real number satisfying 0<=au<1), and
(if ku=ms, then au=0)
[Math. 18]

$$u\_ex = (1-au) \cdot ST1(ku) + au \cdot STex1(ku+1) \quad (18)$$

(where u_ex is an integer satisfying 0<=u_ex<=1), but
(when ku=ms, au=0 and u_ex=1)

When the migration amount measurement table ST1 represents a monotonic increase and ST1(0)=0 and ST1(ms)=1 are satisfied, values of ku and au can be uniquely determined as shown in mathematical expression (19) with respect to a measured migration amount expectation value u_ex between 0 and 1. When ST1(ku)=ST1(ku+1), a low ku is associated and au=0 is assumed with respect to u_ex. However, as an exception, ku=ms and au=0 are satisfied when ST1(ms−1)=ST1(ms)=1.
[Math. 19]

$$au = (u\_ex - ST1(u))/(ST1(ku+1) - (ST1(ku)) \quad (19)$$

(where ST1(ku)<=u_ex<ST1(ku+1))

According to mathematical expressions (17) to (19) presented above, an assumed migration amount u that corresponds to an arbitrary measured migration value expectation value u_ex can be determined. In this description, this relationship will be described as "a corrected migration amount that provides an actual migration amount of u_ex is u".

An actual migration amount u2_ex will now be discretely defined as shown in mathematical expression (20).
[Math. 20]

$$u2\_ex = ku2 \cdot ds \text{ (where } ku2 \text{ is an integer satisfying } 0 <= ku2 <= ms) \quad (20)$$

Based on mathematical expressions (17) to (19), a corrected migration amount that provides the actual migration amount u2_ex can be determined. Since an actual migration amount is determined according to a value of an integer ku2 with mathematical expression (20), a corrected migration amount table ST2 can be created by using a value of ST2(ku2) as a corrected migration amount that provides the actual migration amount u2_ex.

While a corrected migration amount when an actual migration amount is a positive value has been determined above, a corrected migration amount when an actual migration amount is a negative value can be determined in a similar manner through measurement. However, since migration takes place in a symmetrical shape in an interpolation by the first and second processes, a corrected migration amount in a case where an actual migration amount is negative can be determined by changing a sign of the actual migration amount to positive, referencing the corrected migration amount table, and changing a sign of a value determined by reference to negative. In other words, ST2(−ku2)=−ST2(ku) can be assumed. In addition, ST2(−ku2)=−ST2(ku) can be assumed in a similar manner with cubic interpolation and Lanczos interpolation.

In the case of interpolation according to the first and second processes described earlier, a position (x, y) of an interpolation point of interest is similarly assumed to be (x, y)=(x0+dx, y0+dy) (where x0, y0 are integer values and ds, dy are real values satisfying −0.5<=dx<0.5 and −0.5<=dy<0.5). In the third process, dx, dy are separated as shown in mathematical expressions (21) and (22) below and corrected migration amounts dx_h, dy_h are determined as shown in mathematical expressions (23) and (24) below so that the interpolation point of interest (x, y) becomes an actual interpolation point.
[Math. 21]

$$dx = kdx \cdot ds + adx \cdot ds \quad (21)$$

(where kdx is an integer satisfying ms/2<=kdx<=ms/2), and
(adx is a real number satisfying 0<=adx<1.0)
[Math. 22]

$$dy = kdy \cdot ds + ady \cdot ds \quad (22)$$

(where kdy is an integer satisfying ms/2<=kdy<=ms/2), and (ady is a real number satisfying 0<=ady<1.0)

[Math. 23]

$$dx\_h=(1-adx)\cdot ST2(kdx)+adx\cdot ST2(kdx+1) \quad (23)$$

[Math. 24]

$$dy\_h=(1-ady)\cdot ST2(kdy)+ady\cdot ST2(kdy+1) \quad (24)$$

Although a corrected interpolation point (x_h, y_h) satisfies (x_h, y_h)=(x0+dx_h, y0+dy_h), an interpolation value calculated by interpolating the corrected interpolation point (x_h, y_h) by a prescribed interpolation method is a corrected interpolation value of the interpolation point (x, y) according to the third process.

Moreover, when the prescribed interpolation method is a method where a weighting calculation is performed by referencing a table as is the case of the second process, interpolation can be performed by discretizing an actual migration amount per ds step, calculating and tabulating a weight (corrected weight) of each corrected migration amount (creating a corrected weight table), determining a corrected weight that provides an actual migration amount s from the corrected weight table by an interpolation calculation, and calculating a product sum using the corrected weight.

Alternatively, in the case of cubic convolution or the like, interpolation can also be performed by determining a table of corresponding corrected migration amounts per ds step for actual migration amounts s from 0 to 1, creating a weight of cubic interpolation based on a corrected migration amount that provides an actual migration amount, and performing a product sum calculation. Furthermore, interpolation can also be performed by creating a table of weights of cubic convolution of corrected migration amounts instead of a table of corrected migration amounts, determining a weight of a corrected migration amount with respect to an actual migration amount by calculation, and performing interpolation by a weight calculation of the corrected migration amount.

With the third process described above, a migration accuracy of the first or second process can be improved. Specifically, accuracy can be improved to an error size of around 0.04 pixels which is a further improvement of approximately twofold compared to the migration accuracy of a translated image that is achieved by the first or second process. In particular, when cubic interpolation is used as the prescribed interpolation method, since a small error of around 0.004 pixels can be realized even if a 4*4 pixel partial image to be cut out for interpolation is small, interpolation with high migration accuracy can be executed at high speed.

Moreover, while an actual migration amount of a translated image created by performing interpolation using a prescribed interpolation method is measured by phase restriction correlation method in the description given above, there are various other methods of measuring a migration amount such as a method involving estimating a migration amount in subpixels from an evaluation value of matching between an original image and a translated image, whereby a corrected migration amount is determined in a similar manner based on data obtained by measuring a migration amount using such measurement methods to determine a corrected interpolation value.

(Fourth Process)

A fourth process relates to a method of creating a distortion-corrected map from a distortion map of an image.

A corrected image can be created by correcting distortion of a photographed image with a suitable migration amount and interpolating interpolation points. However, since an interpolation point cannot be directly determined from a distortion map of an image, a distortion-corrected map is created from the distortion map. A position of an interpolation point can be directly obtained by referencing the distortion-corrected map.

When a lens distortion exists and causes a distortion in a photographed image, in order to determine from where a point on the photographed image had migrated due to the distortion, a migration amount due to the distortion can be measured at each point on the photographed image and a distortion map using the migration amount as a value at each point can be created. Retracing the distortion map reveals a position at which a point in a case where there is no distortion appears due to distortion. However, generally, even when a value of a distortion map expressed by real numbers is referenced from a point at integer coordinates and a position of an original point in a case where there is no distortion is determined, the coordinate of the point is not an integer value. In other words, the position of the original point is not a position of a pixel in an image. In consideration thereof, a distortion-corrected map that indicates a position at which an integer coordinate point in a case where there is no distortion appears due to distortion is to be created from a distortion map.

The fourth process involves determining a calculation error of an asymptotic approximation calculation during a calculation for creating a distortion-corrected map from a distortion map and repeating the asymptotic approximation calculation until the calculation error falls within a prescribed range. Accordingly, a distortion-corrected map can be created while ensuring that calculation error is within a prescribed range such as 0.00001 pixels.

Specifically, with respect to four adjacent points of interest on a distortion map, positions on an image when there is no distortion from which the points had migrated due to the distortion is determined by referencing the distortion map, and a positional relationship between integer coordinate points (interior points) inside a square having four points that are distortion sources as apexes and a square enclosed by the four distortion source points is respectively determined by the asymptotic approximation calculation described below.

Coordinates of four points p1 to P4 that are distortion sources as determined by referencing a distortion map with respect to four adjacent points of interest on the distortion map are set as p1 (p1x, p1y), P2 (p2x, p2y), P3 (p3x, p3y), and P4 (p4x, p4y). However, it is assumed that P1 and P4, and P2 and P3, exist in diagonal directions. In addition, it is assumed that ax=p2x−p1x, ay=p2y−p1y, bx=p3x−p1x, by=p3y−p1y, cx=p3x−p4x, cy=p3y−p4y, dx=p2x−p4x, and dy=p2y−p4y.

If R(rx, ry) denotes a coordinate of a point R that is a target of determination of whether or not the target is an interior point of the square P1P2P4P4 and fx=rx−p1x and fy=ry−p1y are satisfied, whether or not the point R is an interior point (including on sides) of the square P1P2P4P4 can be determined by mathematical expressions (25) to (28) below.

[Math. 25]

$$\alpha 1=(by\cdot fx-bx\cdot fy)/(ax\cdot by-ay\cdot bx) \quad (25)$$

[Math. 26]

$$\beta 1=(-ay\cdot fx+ax\cdot fy)/(ax\cdot by-ay\cdot bx) \quad (26)$$

[Math. 27]

$$\alpha 2=(dy \cdot fx-dx \cdot fy)/(cx \cdot dy-cy \cdot dx) \quad (27)$$

[Math. 28]

$$\beta 2=(-cy \cdot fx+cx \cdot fy)/(cx \cdot dy-cy \cdot dx) \quad (28)$$

If a calculation of mathematical expressions (25) to (28) results in $0<=\alpha 1$, $0<=\beta 1$, $0<=\alpha 2$, and $0<=\beta 2$, then point R is an interior point of the square P1P2P4P3.

When point R is an interior point of the square P1P2P4P3, initial values of proportions α, β at the interior point are defined based on mathematical expressions (29) and (30) below, and by adopting k as a loop value of an asymptotic calculation, the following asymptotic calculation is repeated starting from k=0 until an error falls below a prescribed value.

[Math. 29]

$$\alpha(0)=(\alpha 1+(1-\alpha 2))/2 \quad (29)$$

[Math. 29]

$$\beta(0)=(\beta 1+(1-\beta 2))/2 \quad (30)$$

[Math. 31]

$$dfx(k)=fx-(\alpha(k) \cdot ax+\beta(k) \cdot bx-\alpha(k) \cdot \beta(k) \cdot (ax+cx)) \quad (31)$$

[Math. 32]

$$dfy(k)=fy-(\alpha(k) \cdot ay+\beta(k) \cdot by-\alpha(k) \cdot \beta(k) \cdot (ay+cy)) \quad (32)$$

[Math. 33]

$$\epsilon(k)=sqrt(dfx(k) \cdot dfx(k)+dfy(k)) \quad (33)$$

[Math. 34]

$$r11=ax-\beta(k) \cdot (ax+c) \quad (34)$$

[Math. 35]

$$r12=bx-\alpha(k) \cdot (ax+cx) \quad (35)$$

[Math. 36]

$$r21=ay-\beta(k) \cdot (ay+cy) \quad (36)$$

[Math. 37]

$$r22=by-\alpha(k) \cdot (ay+cy) \quad (37)$$

[Math. 38]

$$d\alpha(k)=(r22 \cdot dfx(k)-r12 \cdot dfy(k))/(r11 \cdot r22-r12 \cdot r21) \quad (38)$$

[Math. 39]

$$d\beta(k)=(-r21 \cdot dfx(k)+r11 \cdot dfy(k))/(r11 \cdot r22-r12 \cdot r21) \quad (39)$$

[Math. 40]

$$\alpha(k+1)=\alpha(k)+d\alpha(k) \quad (40)$$

[Math. 41]

$$\beta(k+1)=\beta(k)+d\beta(k) \quad (41)$$

Mathematical expressions (31) and (32) above represent errors in an x direction and a y direction, and mathematical expression (33) represents an overall error. When the error represented by mathematical expression (33) is within a prescribed value such as 0.00001, α(k) and β (k) at that moment are adopted as proportions α, β of distances from points on both sides of the interior point, and if not, α(k+1) and β (k+1) are calculated by performing the calculations of mathematical expressions (34) to (41). The calculations of mathematical expressions (31) to (33) are performed by using k+1 as k and an error when k+1 is calculated to determine whether the error is within the prescribed value. This operation is repeated until the error falls within the prescribed value.

As described above, an error when point R is expressed as a proportion of distances from points on both sides of the square P1P2P4P3 is evaluated, whereby proportions α, β are determined by an asymptotic calculation until the error falls within a prescribed value.

When α, β are determined as described above, if (q1x, q1y) denotes an upper left coordinate of the four adjacent points of interest and (rx, ry) denotes a coordinate of an interior point, then it is shown that the interior point (rx, ry) migrates to coordinate (q1x+α, q1y+β) due to the distortion. A value at coordinate (rx, ry) on the distortion-corrected map is a migration amount (q1x+α−rx, q1y+β−ry).

As described above, with respect to all of four adjacent points of a distortion map, by determining a value of a distortion map of an interior point of a square formed by four corresponding points of a distortion source, values on a distortion-corrected map of all interior points are determined.

Furthermore, a distortion-corrected range map can be created by adopting 1 as a value on the distortion-corrected range map for points where values on the distortion-corrected map have been determined as described above and adopting 0 as a value on the distortion-corrected range map for points where values on the distortion-corrected map have not been determined.

According to the fourth process described above, a calculation error of a position of a coordinate point when calculating a coordinate of an interpolation point can be ensured to be smaller than a prescribed value.

Moreover, while initial values of the mathematical expressions (29) and (30) presented above are set to initial values that are efficient when performing an asymptotic calculation using a calculation for determining an interior point, if efficiency is not an issue, other values such as α(0)=0 and β(0)=0 may be adopted as the initial values.

In addition, while a distortion map is assumed to represent a migration amount due to distortion in a photographed image that has been distorted by a lens distortion or the like with respect to where a point on the photographed image has migrated from due to the distortion, the present invention is not limited thereto. As another example, a distortion map may represent a migration amount when artificially performing desired image deformation instead of lens distortion.

Embodiments of the present invention which use the first to fourth processes described above will now be described with reference to the drawings.

(First Embodiment)

FIG. 1 is a block diagram showing a functional configuration of an image processing apparatus according to a first embodiment. The image processing apparatus according to the present embodiment uses the third process described above. With reference to FIG. 1, an image processing apparatus 10 includes an interpolation value calculation unit 11, a translated image creation unit 12, a migration amount measurement unit 13, a correspondence creation unit 14, and a corrected interpolation value calculation unit 15.

The interpolation value calculation unit 11 calculates an interpolation value of an interpolation point based on a prescribed interpolation method that uses a distance between an interpolation point of an inputted image and an integer coordinate position in a vicinity of the interpolation point as a parameter value. While the interpolation method used by the interpolation value calculation unit 11 is not particularly limited, examples of the interpolation method used by the interpolation value calculation unit 11 and a functional configuration of the interpolation value calculation unit 11 will be described later.

The translated image creation unit 12 creates a translated image by defining an interpolation point, such as the interpolation point described above in reference to interpolation value calculation unit 11, by configuring a desired assumed migration amount as a parameter value of the interpolation value calculation unit 11 and having the interpolation value calculation unit 11 perform an interpolation process on the inputted image. In some implementations, interpolation value calculation unit 11 may use the desired assumed migration amount as a parameter value as part of an implementation of the third process.

The migration amount measurement unit 13 measures a measured migration amount from the inputted image with respect to the translated image created by the translated image creation unit 12.

The correspondence creation unit 14 determines correspondence information, such as that described above in reference to the third process and to in reference to table ST1, that enables obtaining a corrected migration amount to be configured as a parameter value in order to obtain an interpolation value of an interpolation point of an actual migration amount, from the actual migration amount on the basis of a relationship between the assumed migration amount and the measured migration amount as measured by the migration amount measurement unit 13 with respect to the translated image.

Based on the correspondence information, the corrected interpolation value calculation unit 15 determines a corrected migration amount obtained when a distance between an interpolation point of the inputted image and an integer coordinate position in a vicinity of the interpolation point is adopted as an actual migration amount, and performs an interpolation process on the inputted image by configuring the corrected migration amount as a parameter value and by using the same interpolation method as the interpolation value calculation unit 11.

As described above, according to the present embodiment, since a migration amount to be configured as a parameter value of an interpolation process is adjusted based on measurement so that an interpolation process of a migration amount that is desirably actually obtained can be performed by an interpolation method used for interpolation value calculation, a highly accurate interpolation process can be performed.

Moreover, in the present embodiment, the correspondence creation unit 14 may be configured so as include a first correspondence creation unit and a second correspondence creation unit.

The first correspondence creation unit configures a plurality of prescribed values as an assumed migration amount to be provided to the translated image creation unit 12 to create respective translated images, and measures an actual migration amount for each of the translated images using the migration amount measurement unit 13. In addition, the first correspondence creation unit 14 determines a correspondence from an assumed migration amount to a measured migration amount (a first correspondence) so that a conversion from an assumed migration amount to a measured migration amount can be performed by reference. The second correspondence creation unit calculates a correspondence from a measured migration amount to an assumed migration amount (a second correspondence) on the basis of the first correspondence. In other words, a first correspondence is first determined, and a second correspondence (correspondence information) is calculated on the basis of the first correspondence.

In this case, the corrected interpolation value calculation unit 15 may adopt, as a measured migration amount, a distance between an interpolation point of the inputted image and an integer coordinate position in a vicinity of the interpolation point, determine an assumed migration amount corresponding to the measured migration amount on the basis of the second correspondence, and adopt the assumed migration amount as a corrected migration amount to be configured as a parameter value.

Figure 2:
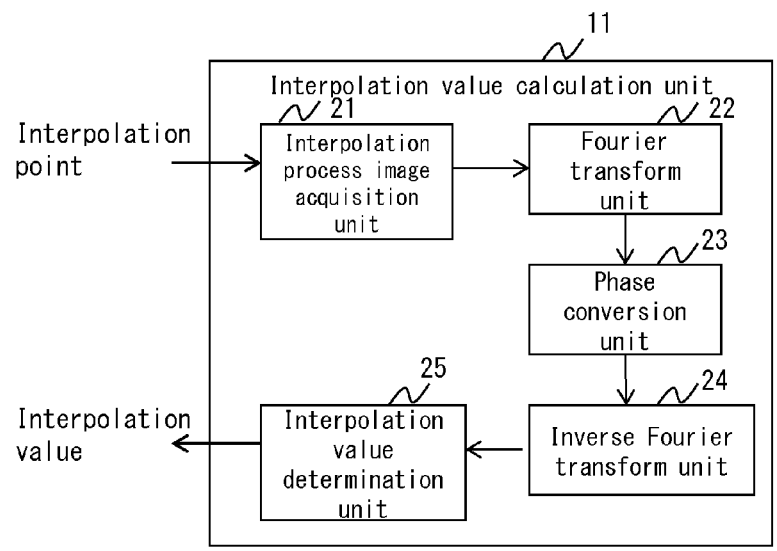
FIG. 2 is a block diagram showing an example of a functional configuration of an interpolation value calculation unit 11 according to the first embodiment.

FIG. 2 is a block diagram showing an example of a functional configuration of the interpolation value calculation unit 11 according to the first embodiment. In this example, the first process described earlier is used. With reference to FIG. 2, the interpolation value calculation unit 11 includes an interpolation process image acquisition unit 21, a Fourier transform unit 22, a phase conversion unit 23, an inverse Fourier transform unit 24, and an interpolation value determination unit 25.

The interpolation process image acquisition unit 21 acquires an interpolation process image of a prescribed size which includes an interpolation point of an inputted image.

The Fourier transform unit 22 performs Fourier transform on the interpolation process image acquired by the interpolation process image acquisition unit 21.

The phase conversion unit 23 changes, based on the shift theorem, a phase of each value of a transformed interpolation process image that has been Fourier transformed by the Fourier transform unit 22 so that the interpolation point migrates to a desired nearby integer coordinate position.

The inverse Fourier transform unit 24 performs inverse Fourier transform on an interpolation process image whose phase has been changed by the phase conversion unit 23.

The interpolation value determination unit 25 adopts a value of a pixel at the integer coordinate position among the transformed interpolation process image that has been inverse Fourier transformed by the inverse Fourier transform unit 24 as an interpolation value of the interpolation point.

According to the example shown in FIG. 2, since inverse Fourier transform is performed by changing a phase by a prescribed amount after subjecting an interpolation process image to Fourier transform, image correction accuracy that is measured by the phase restriction correlation method can be improved without having to increase the number of pixels used to interpolate a single pixel value.

Figure 3:
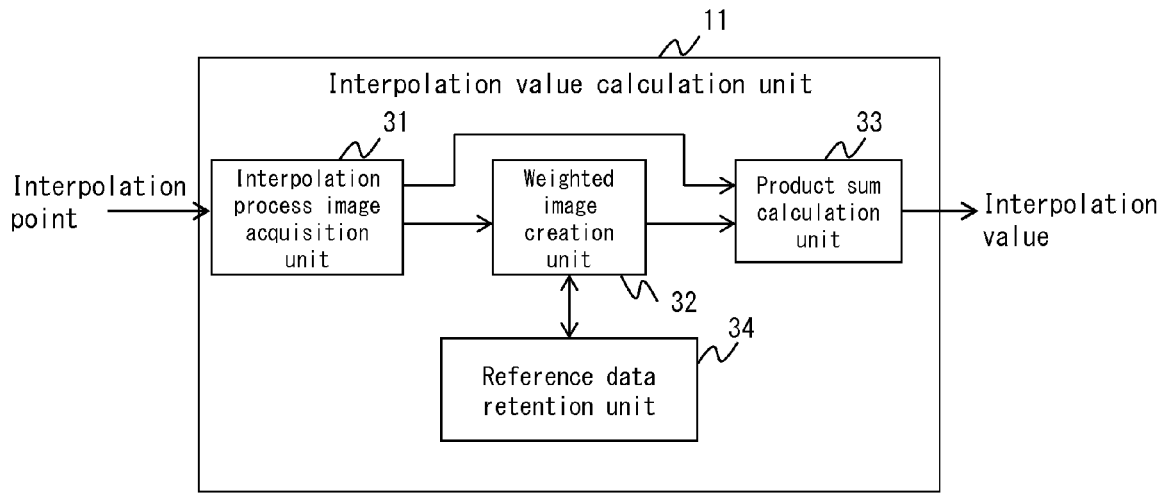
FIG. 3 is a block diagram showing another example of a functional configuration of the interpolation value calculation unit 11 according to the first embodiment.

FIG. 3 is a block diagram showing another example of a functional configuration of the interpolation value calculation unit 11 according to the first embodiment. In this example, the second process described earlier is used. With reference to FIG. 3, the interpolation value calculation unit 11 includes an interpolation process image acquisition unit 31, a weighted image creation unit 32, a product sum calculation unit 33, and a reference data retention unit 34.

The reference data retention unit 34 retains data created by subjecting one-dimensional data with a prescribed length to Fourier transform, as reference data. For example, one-dimensional data is rectangular data whose value changes in a rectangular shape such that the resultant data shape is rectangular e.g. of the form n*m.

The interpolation process image acquisition unit 31 acquires an interpolation process image of a prescribed size which includes an interpolation point of an inputted image.

The weighted image creation unit 32 creates a weighted image of a same size as the interpolation process image by determining a reference position on the basis of a distance between an interpolation point and a desired integer coordinate position in a vicinity of the interpolation point and acquiring data from the reference position in the reference data.

The product sum calculation unit 33 calculates a product sum of the interpolation process image and the weighted image as an interpolation value of the interpolation point.

According to the example shown in FIG. 3, since a product sum of a weighted image acquired from a reference position in reference data obtained by subjecting one-dimensional data to Fourier transform and an interpolation process image is obtained and adopted as an interpolation value of an interpolation point, an interpolation process equivalent to the example shown in FIG. 2 can be performed. Therefore, image correction accuracy that is measured by the phase restriction correlation method can be improved without having to increase the number of pixels used to interpolate a single pixel value.

Moreover, while a functional configuration of the interpolation value calculation unit 11 when using the first or second process has been described with reference to FIGS. 2 and 3, other processes can also be used. For example, the interpolation value calculation unit 11 may be configured to perform an interpolation process by cubic interpolation.

Figure 4:
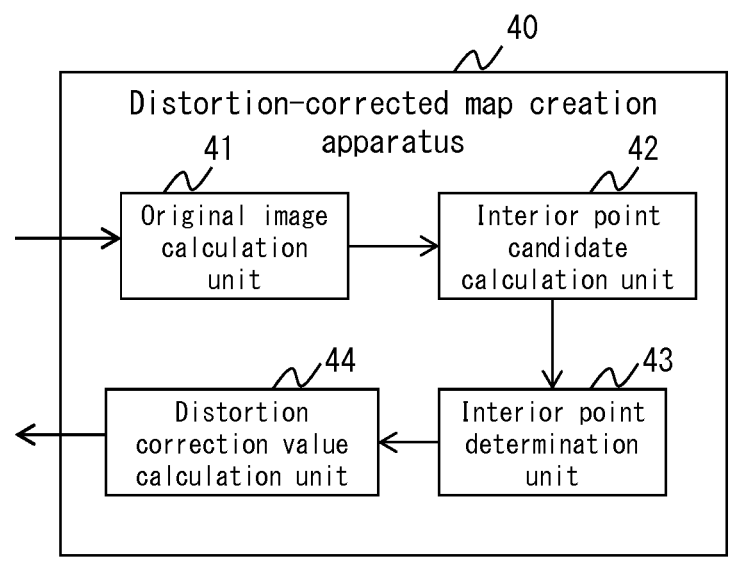
FIG. 4 is a block diagram showing a configuration of a distortion-corrected map creation apparatus according to the first embodiment.

FIG. 4 is a block diagram showing a configuration of a distortion-corrected map creation apparatus according to the first embodiment.

The distortion-corrected map creation apparatus creates a distortion-corrected map from a distortion map. The distortion map is a map showing a point from which each point on an image on which distortion had occurred had originally migrated due to the distortion. The distortion-corrected map is a map showing where each point on an image without the distortion migrates due to the distortion. The distortion-corrected map is used to determine a position of an interpolation point to be inputted to the image processing apparatus 10 when correcting a distorted image. With the distortion-corrected map creation apparatus according to the present embodiment, a distortion-corrected map can be created which enables a position of an interpolation point to be determined with high accuracy.

With reference to FIG. 4, the distortion-corrected map creation apparatus 40 includes an original coordinate calculation unit 41, an interior point candidate calculation unit 42, an interior point determination unit 43, and a distortion correction value calculation unit 44.

The original coordinate calculation unit 41 respectively references values of a distortion map with respect to four adjacent points of interest in the distortion map and calculates coordinates of migration sources of the four points prior to migration by the distortion.

The interior point candidate calculation unit 42 extracts, as an interior point candidate, an integer coordinate value within a first square that is enclosed by a maximum value and a minimum value in an x direction and a maximum value and a minimum value in a y direction among coordinates of the four migration source points.

When the extracted interior point candidate is inside or on a side of a second square that is formed by the four migration source points, the interior point determination unit 43 determines that the interior point candidate is an interior point.

The distortion correction value calculation unit 44 calculates a migration amount of the interior point due to distortion based on a position of the interior point in the second square and configures the migration amount as a value of a distortion-corrected map.

A distortion-corrected map is completed by performing the operations of the original coordinate calculation unit 41, the interior point candidate calculation unit 42, the interior point determination unit 43, and the distortion correction value calculation unit 44 described above while sequentially switching the four points of focus.

Moreover, while an example in which the configuration shown in FIGS. 2 and 3 is incorporated into the interpolation value calculation unit 11 shown in FIG. 1 has been presented in the first embodiment, the present invention is not limited thereto. As another example, an interpolation process can also be performed as an image processing apparatus in which the configuration presented as the interpolation value calculation unit 11 in FIG. 2 or 3 is independent. In a second embodiment to be described below, an example which adopts the independent configuration as a primary configuration will be shown. Even in this case, an improvement in image interpolation accuracy can be achieved in a similar manner.

(Second Embodiment)

Figure 5:
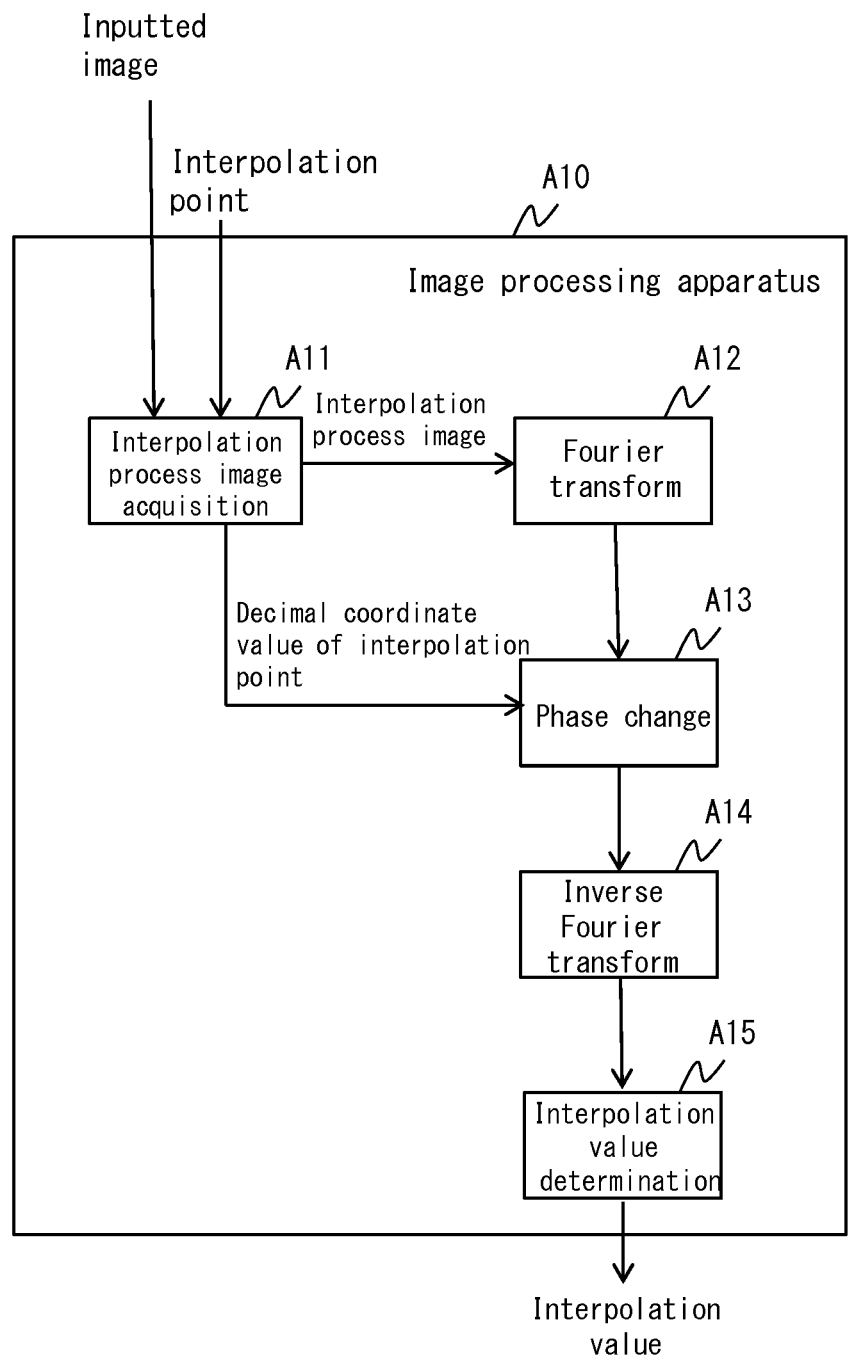
FIG. 5 is a block diagram showing an example of an image processing apparatus according to a second embodiment.

FIG. 5 is a block diagram showing an example of an image processing apparatus according to a second embodiment. FIG. 5 shows an example of performing the first process described above. An image processing apparatus A10 that performs the first process includes an interpolation process image acquisition unit A11, a Fourier transform unit 12, a phase change unit 13, an inverse Fourier transform unit 14, and an interpolation value determination unit 15.

The interpolation process image acquisition unit A11 performs a process of acquiring a partial image by cutting out n*n surrounding pixels from an inputted image so that an integer coordinate of an interpolation point of interest becomes a center position. The cutout partial image is subjected to Fourier transform by the Fourier transform unit A12, subjected to a phase change as described in mathematical expressions (2) to (4) above by the phase change unit A13, and subjected to inverse Fourier transform by the inverse Fourier transform unit A14. A value of a center position of an image obtained as a result of these processes is a value of the interpolation point to be determined.

Moreover, while the phase change unit A13 is based on mathematical expressions (2) to (4) above, the phase change unit A13 references a decimal coordinate of an interpolation point of interest. Accordingly, as a result, a phase is changed based on the shift theorem so that the interpolation point of interest migrates to a center position after Fourier transform.

Figure 6:
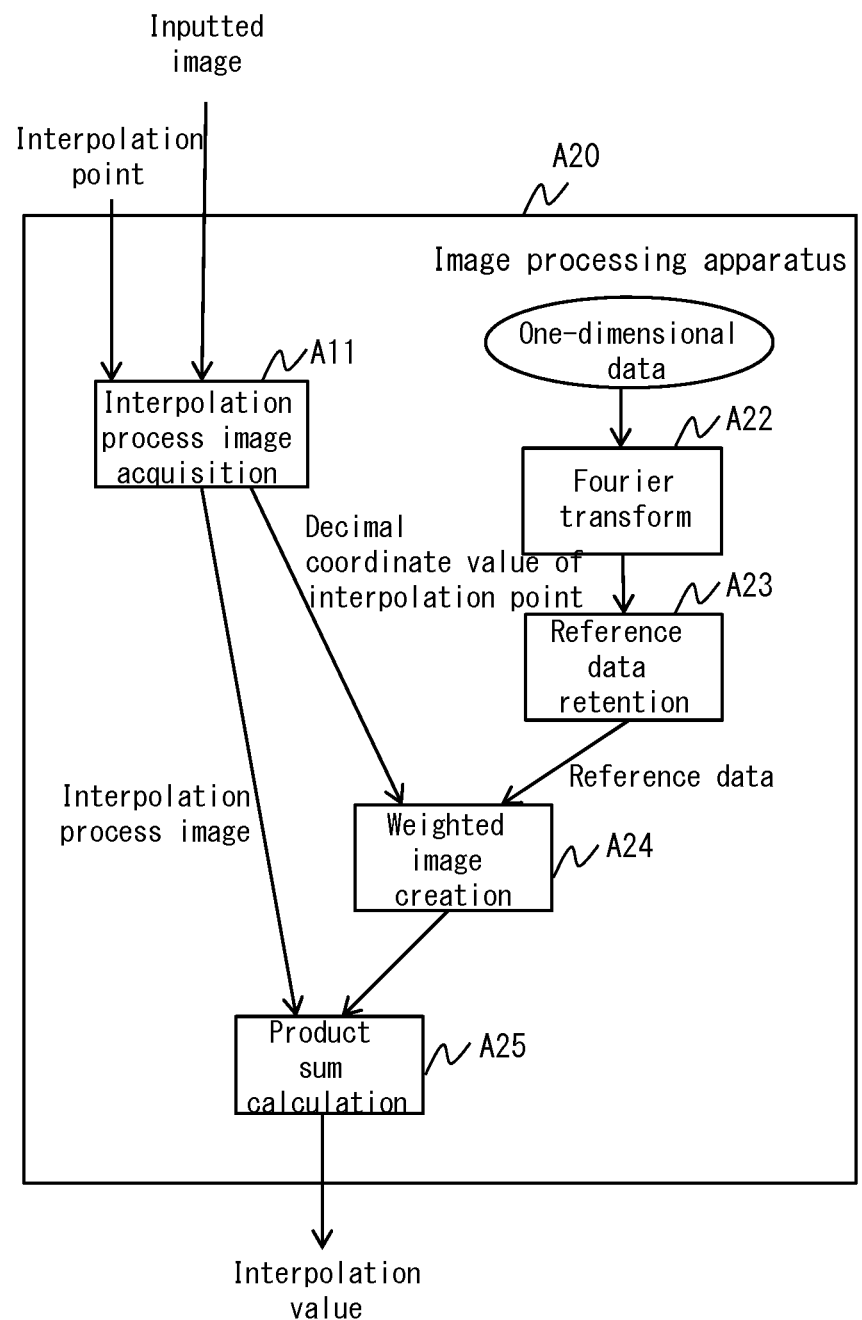
FIG. 6 is a block diagram showing another example of the image processing apparatus according to the second embodiment.

FIG. 6 is a block diagram showing another example of the image processing apparatus according to the second embodiment. FIG. 6 shows an example of performing the second process described above. An image processing apparatus A20 that performs the second process includes the interpolation process image acquisition unit A11, a Fourier transform unit A22, a reference data retention unit A23, a weighted image creation unit A24, and a product sum calculation unit A25.

The Fourier transform unit A22 subjects one-dimensional data to Fourier transform and creates reference data. The reference data retention unit A23 retains the reference data and enables the reference data to be referenced when necessary. The weighted image creation unit A24 creates a weighted image from a decimal coordinate value of an interpolation point and the reference data. The product sum calculation unit A25 multiplies an interpolation process image by values of respective points of the weighted image, calculates a sum of the multiplication results, and adopts the sum as an interpolation value.

Moreover, the rectangular data according to mathematical expression (7) above is adopted as the one-dimension data and when subjected to Fourier transform, reference data for calculating a weight is obtained as shown in mathematical expression (8) above. With the weighted image creation unit A24, by calculating a weight based on mathematical expressions (9) to (15), a weight is created which produces a same interpolation value as the first process described above.

In addition, the reference data retention unit A23 performs a process involving substituting a reference data value for a variable representing reference data in an image processing program. As for the variable representing the reference data, a value can be referenced by a program for creating a weighted image.

Figure 7:
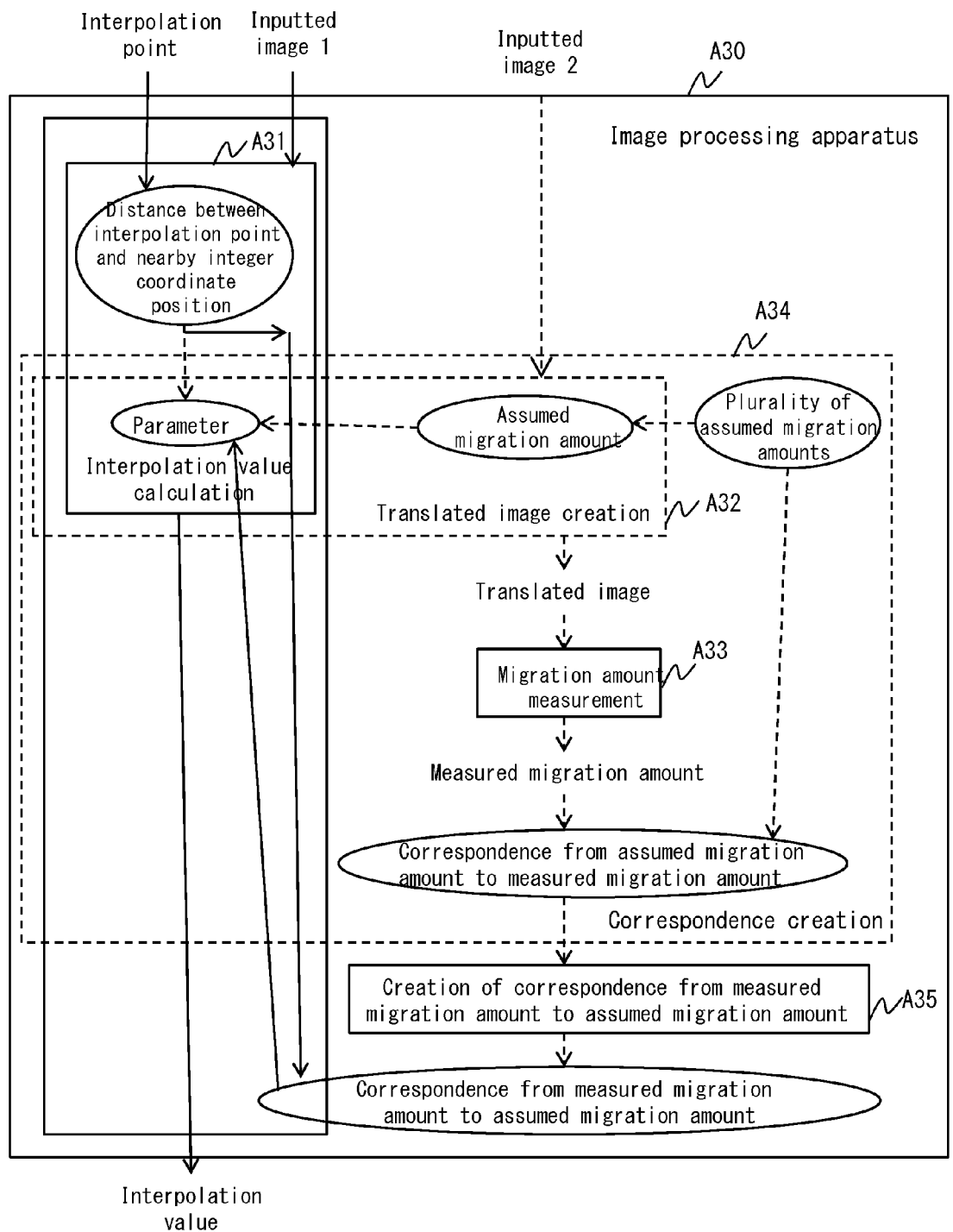
FIG. 7 is a block diagram showing yet another example of the image processing apparatus according to the second embodiment.

FIG. 7 is a block diagram showing yet another example of the image processing apparatus according to the second embodiment. FIG. 7 shows an example where the third process described above is performed. An image processing apparatus A30 that performs the third process includes an interpolation value calculation unit A31, a translated image creation unit A32, a migration amount measurement unit A33, a correspondence creation unit A34 that creates a correspondence from an assumed migration amount to a measured migration amount, a correspondence creation unit A35 that creates a correspondence from a measured migration amount to an assumed migration amount, and an corrected interpolation value calculation unit A36.

The interpolation value calculation unit A31 calculates an interpolation value according to, for example, the first or second process described above. With the first process or the second process described above, an interpolation process is performed which adopts a distance between an interpolation point expressed as a decimal coordinate and an integer coordinate position in a vicinity of the interpolation point as a parameter value. The translated image creation unit A32 creates an translated image by providing an assumed migration amount, substituting the assumed migration amount into the parameter value of the interpolation value calculation unit A31 to define an interpolation point, and subjecting an inputted image to an interpolation process using the interpolation value calculation unit A31. The migration amount measurement unit A33 measures a measured migration amount of the translated image from the inputted image according to the phase restriction correlation method. The correspondence creation unit A34 creates a table of correspondence between an assumed migration amount and a measured migration amount per evenly spaced steps which is represented by the migration amount measurement table ST1 in the third process described above. The correspondence creation unit A35 creates a migration amount measurement table ST2 from the migration amount measurement table ST1 in the third process described above. The corrected interpolation value calculation unit A36 obtains an interpolation value by adopting an inputted image 1 and an interpolation point as input, adopting, as a measured migration amount, a distance between the interpolation point and an integer coordinate position in a vicinity of the interpolation point, determining an assumed migration amount corresponding to the measured migration amount on the basis of the table of correspondence created by the correspondence creation unit A35, and performing an interpolation calculation by substituting the assumed migration amount into the parameter value of the interpolation method used by the interpolation value calculation unit A31.

Moreover, the translated image creation unit A32 performs the interpolation process on all interpolation points necessary for creating a translated image. In addition, the correspondence creation unit A34 determines a correspondence from an assumed migration amount to a measured migration amount by configuring a plurality of prescribed values (for each evenly spaced step in the description above) as the assumed migration amount to be provided to the translated image creation unit A32 and creating respective translated images, and measuring an actual migration amount for each of the translated images using the migration amount measurement unit A33.

In FIG. 7, the corrected interpolation value calculation unit A31 executes a process along solid lines by adopting the inputted image 1 and an interpolation point as input and outputs an interpolation value. In addition, processes depicted by a flow of dotted lines that originate at and connect from an inputted image 2 or a plurality of assumed migration amounts are processes which, when performed, need not be repeated once the correspondence from a measured migration amount to an assumed migration amount is determined. Therefore, once the correspondence from a measured migration amount to an assumed migration amount is determined, the correspondence is saved and implemented so as to be derived and referenced when necessary.

Figure 8:
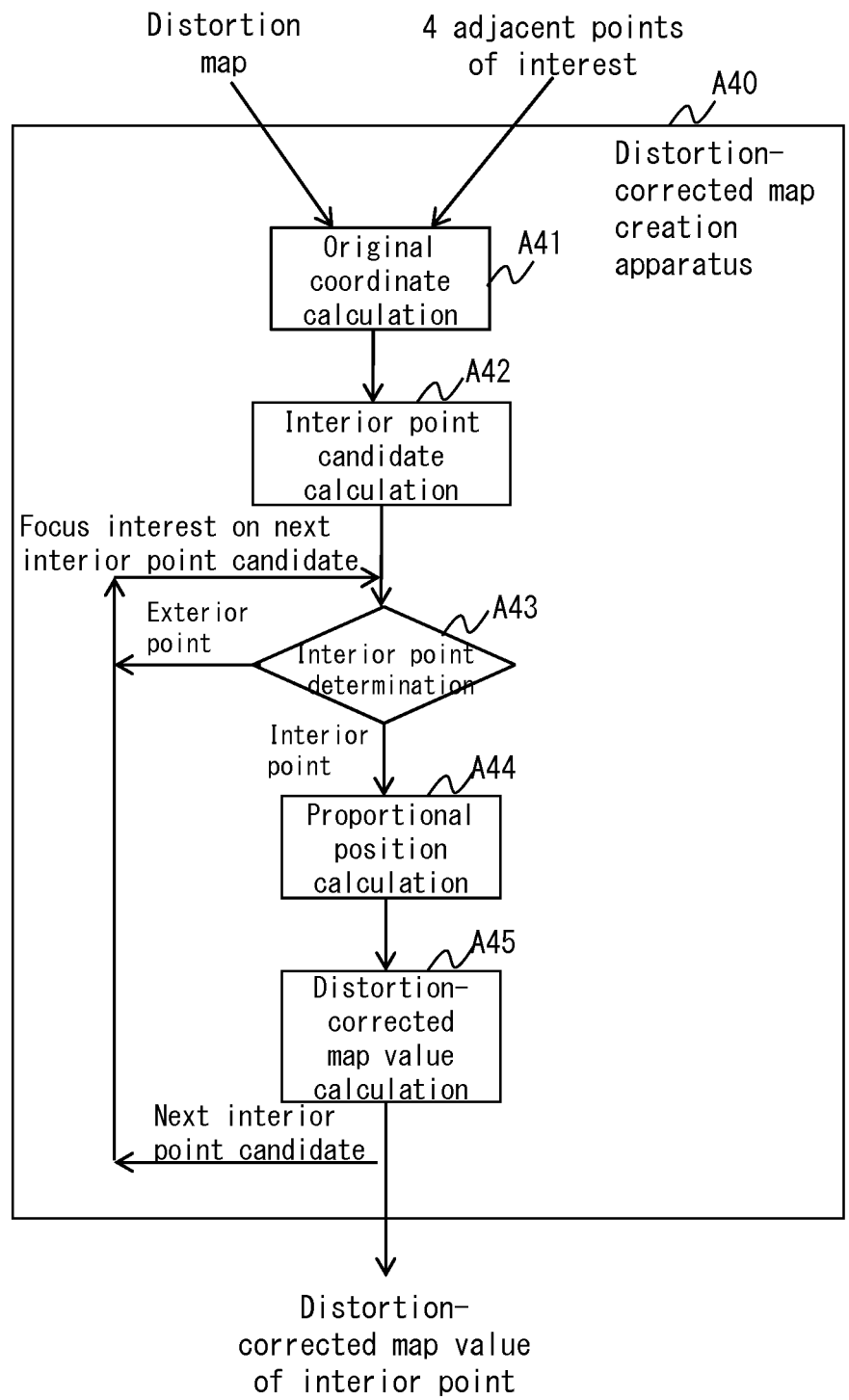
FIG. 8 is a block diagram showing a configuration of a distortion-corrected map creation apparatus according to the second embodiment.

FIG. 8 is a block diagram showing a configuration of a distortion-corrected map creation apparatus according to the second embodiment. FIG. 8 shows an example of performing the fourth process described above. A distortion-corrected map creation apparatus A40 that performs the fourth process includes an original coordinate calculation unit A41, an interior point candidate calculation unit A42, an interior point determination unit A43, a proportional position calculation unit A44, and a distortion-corrected map value calculation unit A45.

The distortion-corrected map creation apparatus A40 accepts a distortion map and four adjacent points of interest as input and outputs a distortion-corrected map of an interior point of a square enclosed by original coordinates of the four points of interest prior to distortion. Since the coordinate of an interior point assumes an integer coordinate, there may be cases where there are a plurality of interior points, where there are no interior points, or where there is no distortion-corrected map values to be outputted. A distortion-corrected map is a map showing where each point on an image without distortion migrates due to the distortion. In this case, although a distortion-corrected map value can only be obtained for coordinates that coincide with interior points, by changing positions of the four adjacent points of interest, a distortion-corrected map value of another position can be obtained.

The original coordinate calculation unit A41 adopts a distortion map and four adjacent points of interest as input and determines coordinate values of migration sources of the four points prior to migration by the distortion. The interior point candidate calculation unit A42 adopts, as an interior point candidate, an integer coordinate value within a first square that is enclosed by a maximum value and a minimum value in an x direction and a maximum value and a minimum value in a y direction among coordinates of the four migration source points. When the interior point candidate is inside or on a side of a second square that is formed by the four migration source points as shown by mathematical expressions (25) to (28) described above, the interior point determination unit A43 determines that the interior point candidate is an interior point. The proportional position calculation unit A44 calculates a proportional position of the interior point in the second square to a prescribed accuracy as shown by mathematical expressions (29) to (41) described above. As shown, since the proportional position is calculated to a prescribed accuracy, a distortion-corrected map that is calculated based on the proportional position can be determined at high accuracy. In this case, a proportional position of an interior point in a square is a representation of a position of a straight line connecting a position of an intersection of a same proportion from ends of two opposing sides and a straight line connecting a position of a same proportion from ends of the other two opposing sides by the two proportions. The distortion-corrected map value calculation unit A45 calculates a value of the distortion-corrected map at the interior point position on the basis of a proportional position of the interior point. In the description above, if α, β denotes the two proportions, (q1x, q1y) denotes an upper left coordinate among the four adjacent points, and (rx, ry) denotes a coordinate of an interior point, then the interior point (rx, ry) migrates to coordinate (q1x+α, q1y+β) due to the distortion. Therefore, a value at coordinate (rx, ry) on the distortion-corrected map is a migration amount (q1x+α−rx, q1y+β−ry).

Image processing such as described above can be performed in various modes. For example, by presenting a processing procedure of image processing according to the examples given below, a person with ordinary knowledge of hardware can create hardware equipped with functions for performing the processing procedure. In addition, a person with ordinary knowledge of software can create software that realizes an image processing procedure according to the present invention and have a commercially available generic computer execute the image processing procedure. Furthermore, as is well known, when using a generic computer, a storage medium that stores software can be inserted into another computer without specifying the computer and have the computer execute the software. Therefore, a storage medium storing the software constitutes an important universal element for implementing the entire present invention and also constitutes an embodiment of the present invention that accommodates arbitrary incorporation destinations. Examples of a storage medium that stores software include a CD, a DVD, a memory card, an HD, and an external storage apparatus that can be connected or downloaded via the Internet.

(1) Example 1

(1-1) Configuration

Figure 9:
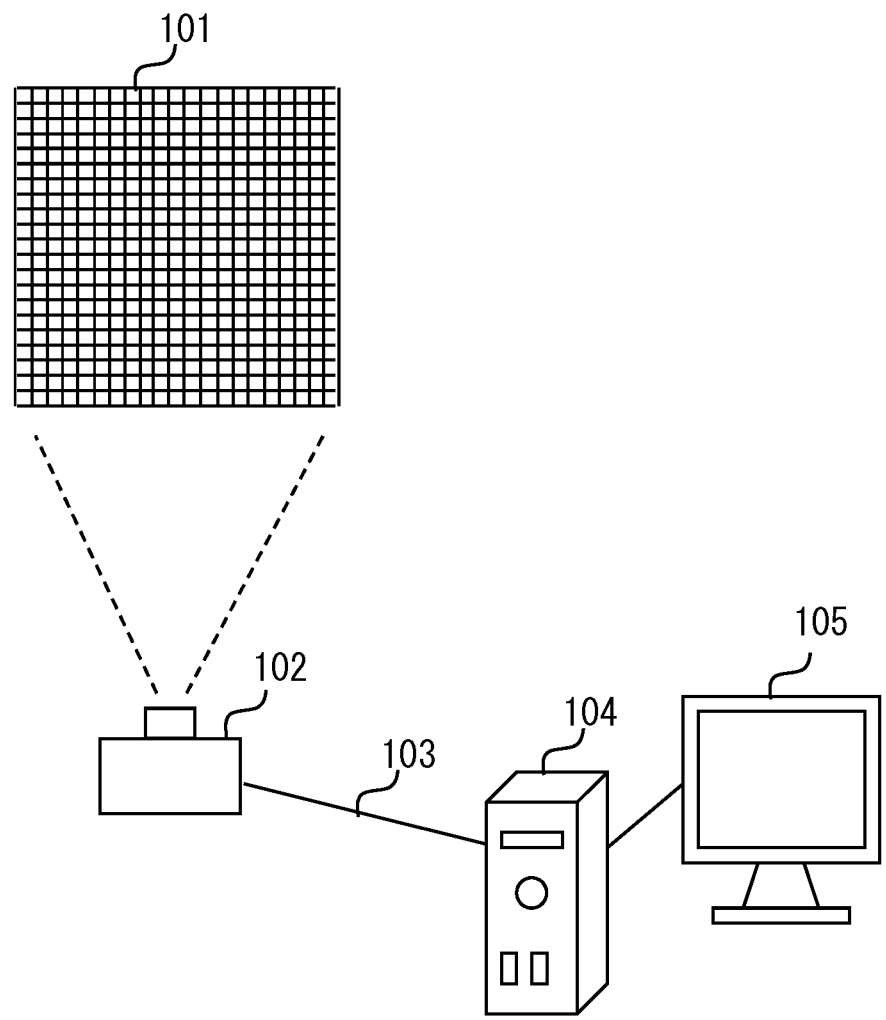
FIG. 9 is a system configuration diagram of Example 1.

FIG. 9 shows a system configuration of Example 1.

The present system is a system for correcting distortion of an image photographed by a digital camera.

A distortion measurement subject 101 having a plurality of straight lines drawn horizontally and vertically is photographed by a digital camera 102. In addition, various other subjects are also photographed using the same digital camera 102. The digital camera 102 can be connected to a computation apparatus 104 by a cable 103. Data of an image photographed by the digital camera 102 can be transmitted to and saved in the computation apparatus 104. The computation apparatus 104 is an apparatus for performing prescribed image processing on image data and displaying a result thereof on a display apparatus 105. The computation apparatus 104 creates a distortion-corrected map from a photographed image of the distortion measurement subject 101 and corrects distortion of photographed images of the various subjects using the distortion-corrected map.

(1-2) Outline of Overall Procedure

Figure 10:
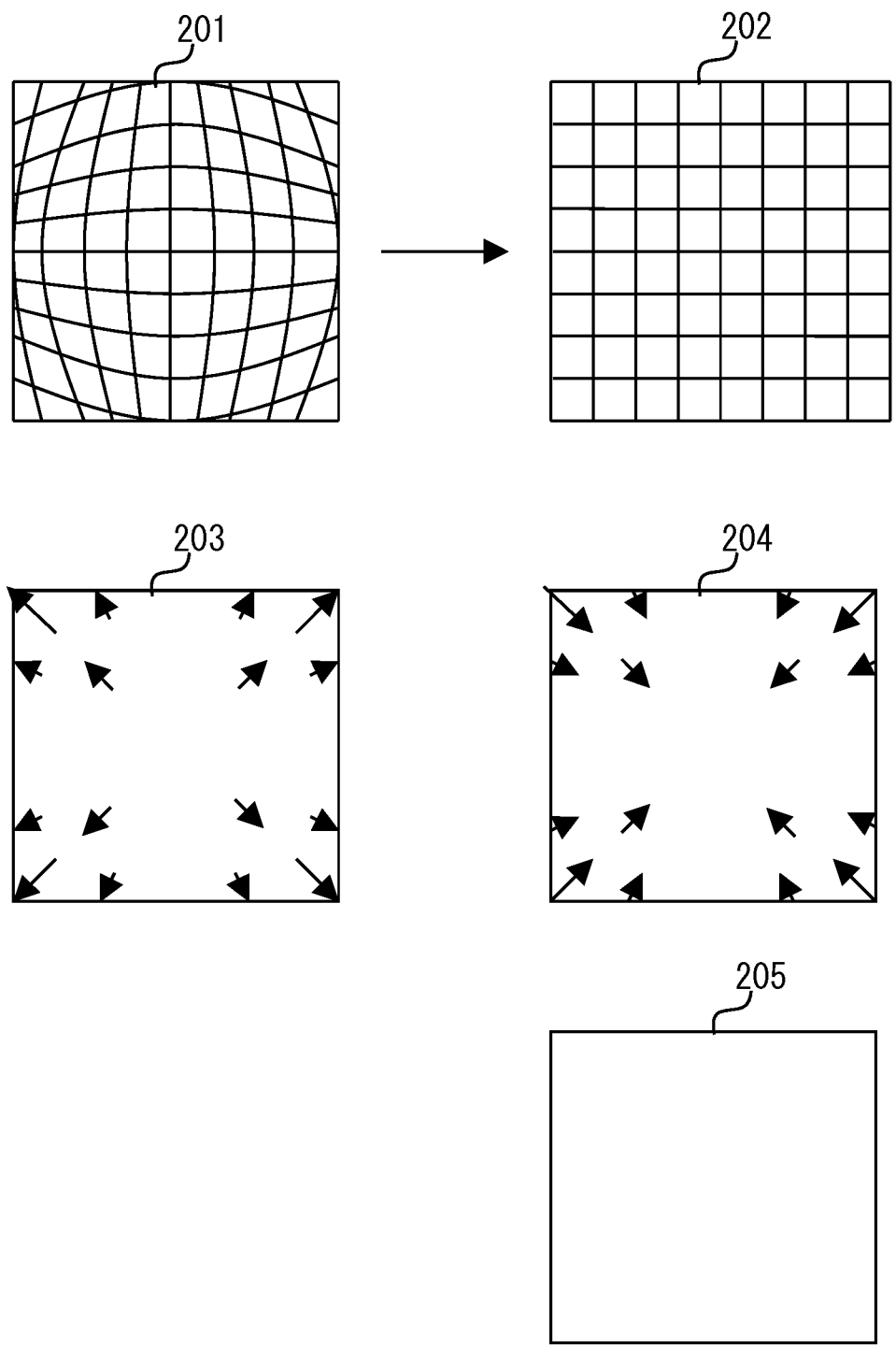
FIG. 10 is a diagram for explaining distortion and correction.
Figure 11:
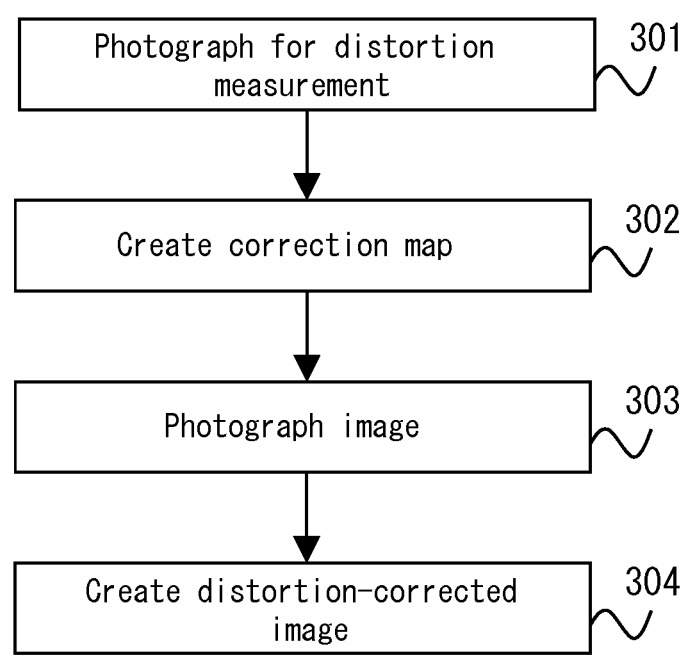
FIG. 11 is a general flow chart showing an overall procedure of Example 1.

FIG. 11 is a general flow chart showing an overall procedure of Example 1. FIG. 10 is a diagram for explaining distortion and correction. Hereinafter, an outline of the respective steps of the procedure shown in FIG. 11 will be described with reference to FIG. 10.

Step 301: Photograph the distortion measurement subject 101 having a plurality of straight lines drawn horizontally and vertically at regular intervals and with equal widths using the digital camera 102 and acquire a distortion measurement image 201.

Step 302: Connect the digital camera 102 and the computation apparatus 104 to each other using the cable 103, and transfer the distortion measurement image 201 to the computation apparatus 104 to be saved therein. The computation apparatus 104 creates a reference image 202 which is free of distortion and which includes horizontal and vertical lines at regular intervals based on an average line interval of the distortion measurement image 201. The computation apparatus 104 compares the distortion measurement image 201 and the reference image 202 with one another to determine from which point of the reference image 202 each pixel in the distortion measurement image 201 had migrated, and creates a distortion map 203. In addition, the computation apparatus 104 creates a distortion-corrected map 204 from the distortion map 203. When necessary, the computation apparatus 104 creates a distortion correction range map 205.

The distortion correction range map 205 is a map showing portions where distortion correction cannot be performed and portions where distortion correction can be performed when correcting distortion of a photographed image. A portion that requires a point out of a field of view of a photographed image to be referenced when performing distortion correction is a portion where distortion correction cannot be performed. A portion where a distortion correction process can be performed by reference within the field of view is a portion where distortion correction can be performed. For example, a portion where distortion correction can be performed is expressed as 1 and a portion where distortion correction cannot be performed is expressed as 0.

Step 303: Photograph various subjects using the digital camera 102.

Step 304: Connect the digital camera 102 and the computation apparatus 104 to each other using the cable 103, and transfer photographed images of the various subjects to the computation apparatus 104 to be saved therein. The computation apparatus 104 references the distortion-corrected map 204 to deform the photographed images of the various subjects so as to correct distortion of the images, and creates distortion-corrected images.

(1-3) Distortion Correction

Figure 12:
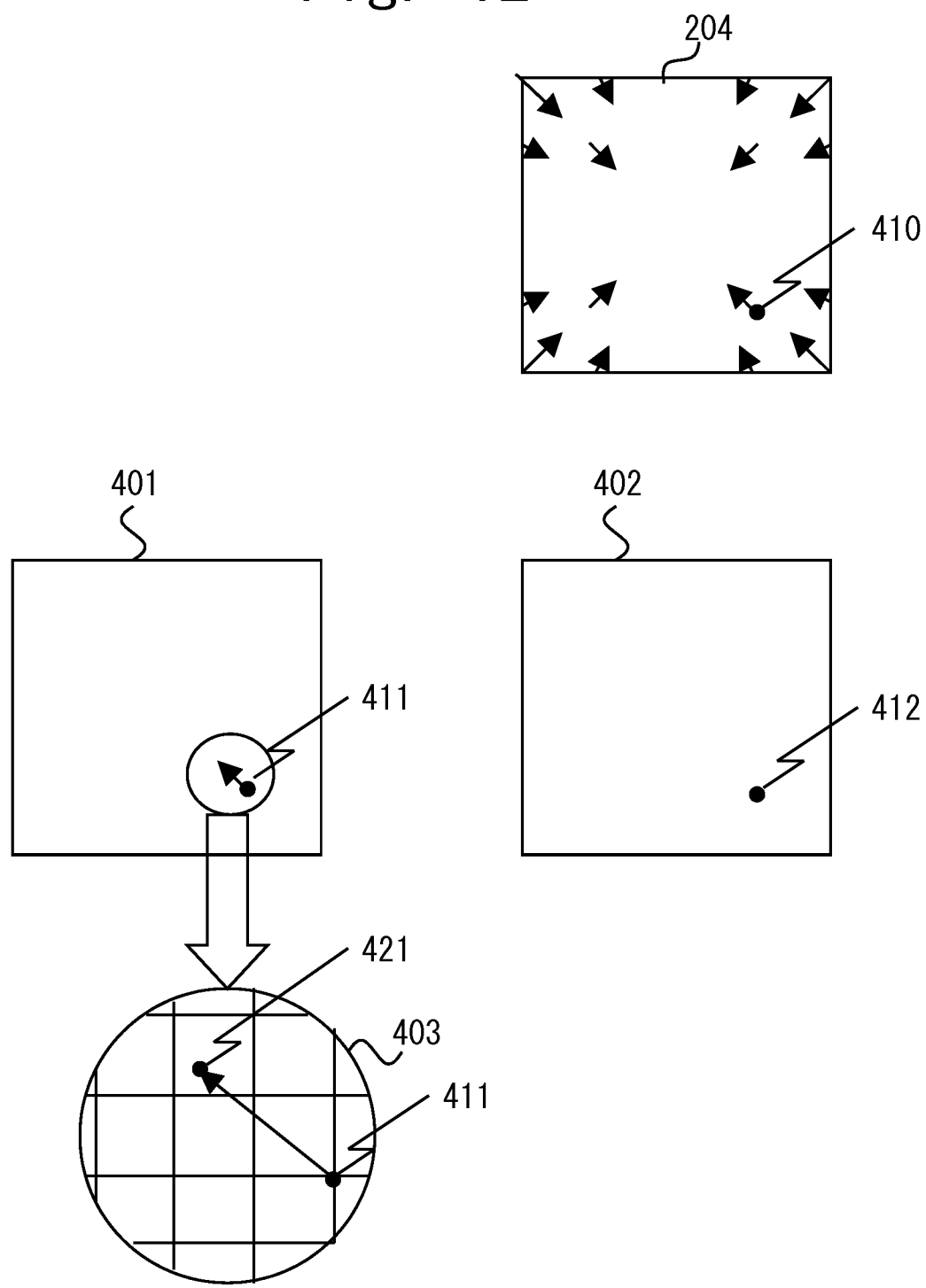

FIG. 12 is a diagram showing the distortion-corrected map 204, an interpolation point 421, and the like. The distortion-corrected map 204 is a map that shows, for each point on an image, a migration amount by which an appeared point migrates due to distortion. Migration distances in horizontal and vertical directions are described at each point.

Let (x_at, y_at) denote a position of an interest point 410 on the distortion-corrected map 204 and (sx_at, sy_at) denote a value of the distortion-corrected map 204 for the interest point 410. An interest point 411 of a photographed image 401 and an interest point 412 of a corrected image 402 are both at a same position (x_at, y_at) as the interest point 410 on the distortion-corrected map 204. An enlarged view 403 of a periphery of the interest point 411 of the photographed image 401 shows the interest point 411 and an interpolation point 421 to be interpolated to which the interest point 411 has migrated due to distortion. A coordinate of the interpolation point 421 is expressed as (x_at+sx_at, y_at+sy_at).

While the interest point 411 is at an integer coordinate position expressed as (x_at, y_at), the interpolation point 421 is generally not at an integer coordinate position. An interpolation value of the interpolation point 421 of the photographed image 401 becomes a value of an interest point (x_at, y_at) of the corrected image 402.

The corrected image 402 is completed by determining an interpolation point on the photographed image 401 for all points of the corrected image 402 by referencing values of corresponding points of the distortion-corrected map 204, determining interpolation values of the respective interpolation points, and adopting the interpolation values as values of the corrected image 402. The corrected image 402 is an image representing the photographed image 401 subjected to a deformation process based on the distortion-corrected map 204.

Moreover, while the interpolation point 421 is within a field of view of the photographed image 301 at a location where the distortion correction range map 205 has a value of 1, the interpolation point 421 is outside of the field of view of the photographed image 301 at a location where the distortion correction range map 205 has a value of 0 and therefore cannot be properly interpolated. In this case, the corrected image 402 may be created by adopting a value in the field of view of the photographed image 301 that is nearest to the interpolation point 421 as a value of the interpolation point 421. Even in such a case, the fact that a value of the distortion correction range map 205 is 0 indicates that the value of the corrected image 402 at this point is unreliable. Accordingly, the portion can be arranged not to be used for subsequent processes.

(1-4) Interpolation Calculation Method 1

Various methods may be used to calculate an interpolation value of an interpolation point on the photographed image 401. One of the interpolation calculation methods according to Example 1 is based on the interpolation method described in the first process.

Figure 13:
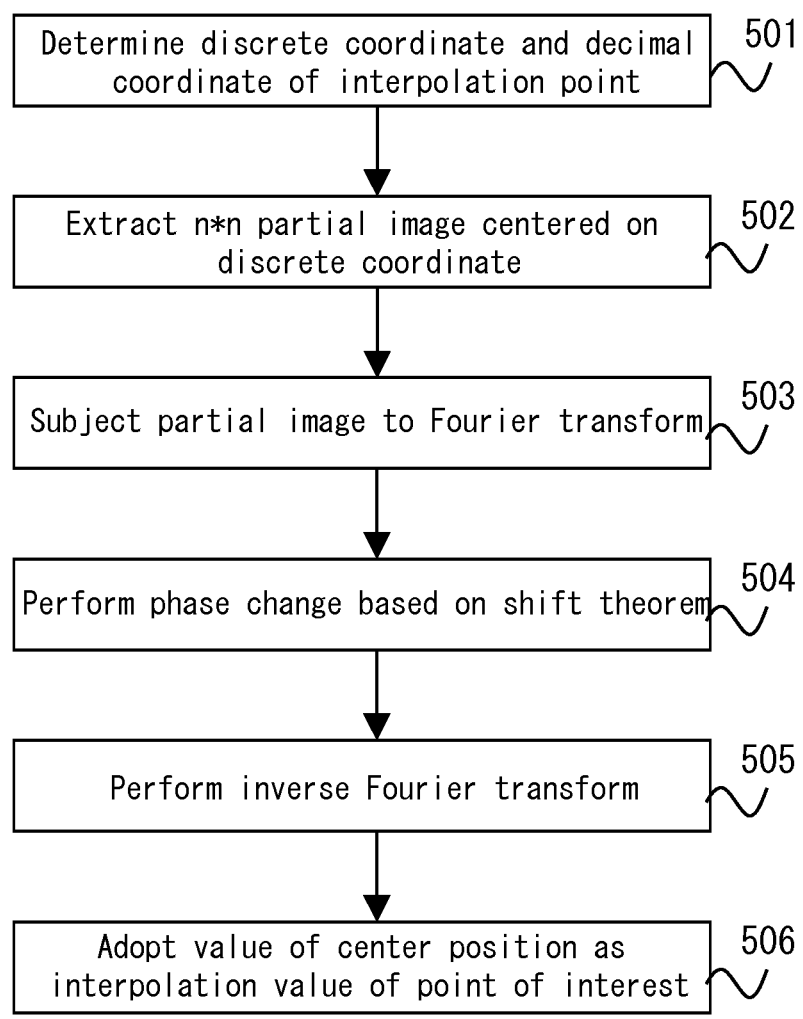
FIG. 13 is a diagram showing a procedure of an interpolation method described in a first process.

FIG. 13 is a diagram showing a procedure of the interpolation method described in the first process. Hereinafter, a procedure of the interpolation method described in the first process will be described with reference to FIG. 13 and the mathematical expressions used in the first process.

Step 501: Let (x, y) denote a position of an interpolation point. Generally, x, y are not integers and are separated into a discrete coordinate (x0, y0) and a decimal coordinate (dx, dy) such that (x, y)=(x0+dx, y0+dy) (where x0, y0 are integer values, $-0.5 \leq dx < 0.5$, and $-0.5 \leq dy < 0.5$).

Step 502: Extract a partial image R of n*n pixels of a photographed image by setting the discrete coordinate (x0, y0) of the photographed image at center (n/2, n/2).

Step 503: Perform Fourier transform on the partial image R. If F denotes Fourier transform, then an image H created by the Fourier transform may be expressed as H=F·R as shown in FIG. 5.

Step 504: Perform a phase shift corresponding to a migration amount (−dx, −dy) on the Fourier transformed image H based on the shift theorem and create a phase shifted image H2. A specific calculation method thereof is described in mathematical expressions (2) to (4).

Step 505: Perform inverse Fourier transform on the phase shifted image H2 and create a transformed image G2. Mathematical expression (1) is a mathematical expression that represents all of the processes from step 502 to 505.

Step 506: Adopt a value of the center position (n/2, n/2) of the transformed image G2 as an interpolation value of the interpolation point (x, y).

Moreover, in the series of processes described above, the process of step 502 can be regarded as a partial image acquisition process for acquiring a partial image of a prescribed size which includes an interpolation point of an inputted image, the process of step 503 can be regarded as a Fourier transform process for subjecting the partial image to Fourier transform, the process of step 504 can be regarded as a phase change process for changing a phase of each value of the transformed partial image after the Fourier transform based on the shift theorem, the process of step 505 can be regarded as an inverse Fourier transform process for subjecting the phase-changed partial image to inverse Fourier transform, and the process of step 506 can be regarded as an interpolation value determination process for adopting a value of a pixel at a prescribed position among the transformed partial image after the inverse Fourier transform as an interpolation value of the interpolation point.

(1-5) Interpolation Calculation Method 2

As another interpolation method according to Example 1, the interpolation method described in the second process can also be used. Hereinafter, a description will be given with reference to the mathematical expressions described in the second process as necessary.

Figure 15:
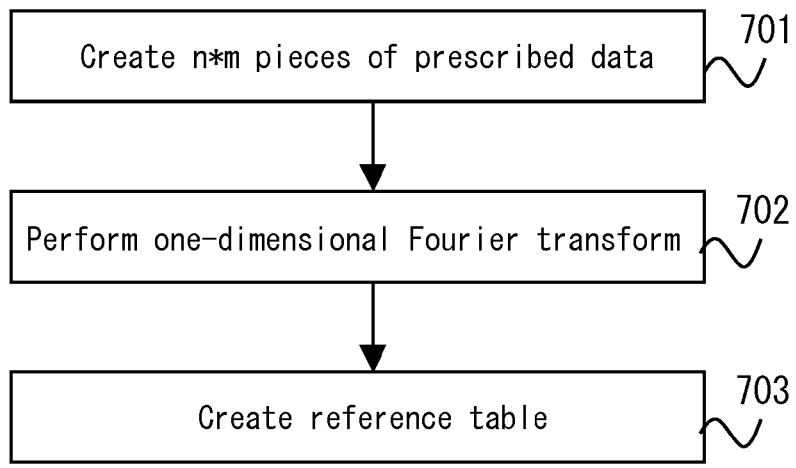
FIG. 15 is a flow chart showing a procedure for creating a reference table that is referenced during interpolation.

FIG. 15 is a flow chart showing a procedure for creating a reference table that is referenced during interpolation. The respective steps in FIG. 15 will now be described.

Step 701: Create n*m pieces of prescribed data (data) based on mathematical expression (7).

Step 702: Create Fourier transformed data (Fdata) by subjecting data (data) created in step 701 to Fourier transform.

Step 703: Calculate (n+2)*m number of reference tables T based on mathematical expression (8).

Figure 14:
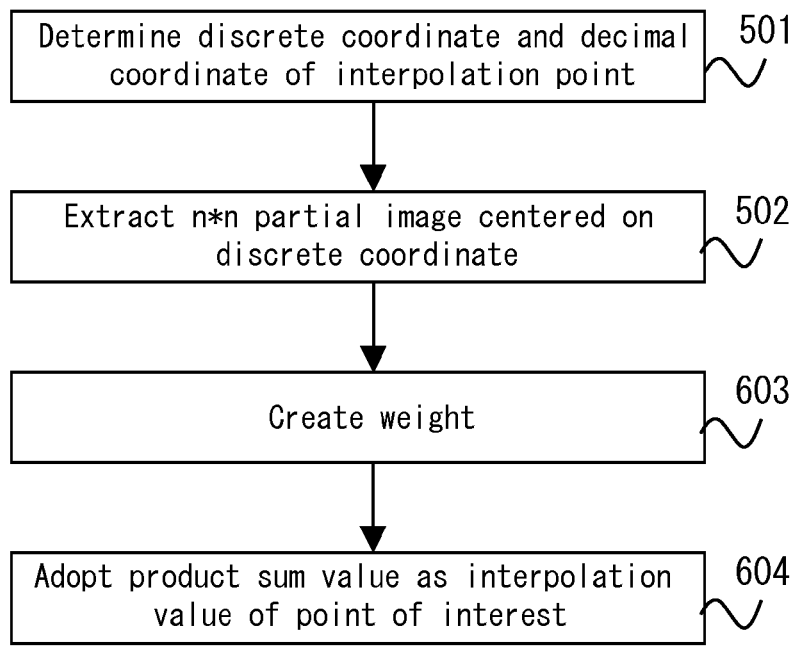
FIG. 14 is a flow chart showing a procedure by which a weight is created by referencing a reference table T and an interpolation value of an interpolation point is determined.

FIG. 14 is a flow chart showing a procedure by which a weight is created by referencing the reference table T and an interpolation value of an interpolation point is determined. The respective steps in FIG. 14 will now be described.

Step 501: Same as step 501 in the interpolation calculation method 1 described above.

Step 502: Same as step 502 in the interpolation calculation method 1 described above.

Step 603: Create a weight W based on mathematical expressions (9) to (15).

Step 604: Determine an interpolation value based on mathematical expression (6).

Moreover, in the series of processes described above, the process of step 502 can be regarded as a partial image acquisition process for acquiring a partial image of a prescribed size which includes an interpolation point of an inputted image, the processes of steps 701 to 703 can be regarded as a reference data creation process for adopting data created by subjecting one-dimensional data of a prescribed length to Fourier transform as reference data, the process of step 603 can be regarded as a weighted image creation process for determining a reference position in the reference data based on a deviation of an interpolation point from a nearby integer coordinate position and creating a weighted image of a same size as the partial image, and the process of step 604 can be regarded as a product sum calculation process for adopting a product sum of the partial image and the weighted image as an interpolation value of the interpolation point.

(1-6) Interpolation Calculation Method 3

As another interpolation method according to Example 1, the interpolation method described in the third process can also be used. Hereinafter, a description will be given based on the mathematical expressions described in the third process.

First, when the interpolation calculation method 1 described above is used as the prescribed interpolation method to be used in the third process, as advance preparation, a point deviated by −ds is interpolated using the interpolation method of interpolation calculation method 1 to create a translated image of an assumed migration amount ds and a migration amount is measured by the phase restriction correlation method. In a prescribed step, the assumed migration amount is changed and a migration amount measurement table ST1 for determining a correspondence between the assumed migration amount and a measured migration amount is created.

Next, based on mathematical expressions (17) to (20) in the third process, a corrected migration amount table ST2 that determines a correspondence between an actual migration amount and a corrected migration amount is created. Once preparation is completed by the creation of the corrected migration amount table, an interpolation calculation according to interpolation calculation method 3 can be performed as described below.

Let (x, y) denote a position of an interpolation point. It is assumed that (x, y)=(x0+dx, y0+dy) is satisfied, x0, y0 are integers, and dx, dy are real numbers satisfying −0.5<=dx<0.5 and −0.5<=dy<0.5. A corrected interpolation point (x_h, y_h)=(x0+dx_h, y0+dy_h) is determined based on mathematical expressions (21) to (24). The interpolation calculation method 3 is a method involving calculating an interpolation value of the corrected interpolation point (x_h, y_h) using the interpolation method described in the interpolation calculation method 1 and adopting the interpolation value as an interpolation value of the interpolation point (x, y).

Alternatively, the interpolation method according to the interpolation calculation method 2 may be used as described in the third process. In this case, a corrected migration amount table may be determined, an interpolation value of a corrected interpolation point (x_h, y_h) may be determined according to the interpolation calculation method 2, and the interpolation value may be adopted as an interpolation value of the interpolation point (x, y). In this case, instead of creating a corrected migration amount table as described in the third process, a corrected weight table can be created and an interpolation value can be determined by performing a product sum calculation using a corrected weight.

Moreover, the series of processes described above can be regarded as executing a translation creation process for creating a translated image having an assumed migration amount using a prescribed interpolation method, executing a migration amount measurement process for measuring a migration amount of the translated image from an input image by a prescribed processing method for a plurality of assumed migration amounts, executing a correspondence creation process involving creating a correspondence between an assumed migration amount and a measured migration amount for determining a correspondence between a migration amount that is assumed and a migration amount that is measured, executing a correspondence creation process involving creating a correspondence between an actual migration amount and a corrected migration amount for determining a corrected migration amount that provides an actual migration amount by which an actual migration is expected from the created correspondence, executing a corrected interpolation point creation process for determining a corrected migration amount having a deviation that equals an interpolation point from an integer position as an actual migration amount by referencing the correspondence between the actual migration amount and the corrected migration amount and determining a corrected interpolation point having a deviation of the corrected migration amount, and executing a corrected interpolation process for interpolating the determined corrected interpolation point by the interpolation method described above and adopting an obtained interpolation value as an interpolation value of an actual interpolation point.

(2) Example 2

A configuration and an overall procedure of Example 2 are the same as the configuration and the overall procedure of Example 1. Methods of correcting distortion also share the same framework, and the only difference lies in specific interpolation calculation methods.

In Example 1, an interpolation method based on the shift theorem of Fourier transform is used as described in (1-4), (1-5), and (1-6) above. In Example 2, interpolation is performed according to a method described in the third process where an interpolation point is corrected while using cubic interpolation as the prescribed interpolation method.

Let (x, y) denote a position of an interpolation point. It is assumed that (x, y)=(x00+dx00, y00+dy00) is satisfied, x00, y00 are integers, and dx00, dy00 are real numbers satisfying 0<=dx00<1, 0<=dy00<1.

With cubic interpolation, an interpolation value g4 is calculated by performing an interpolation calculation based on mathematical expressions (42) to (48) below.

[Math. 42]

$$g4 = (\Sigma ab Wc(a,b) \cdot G(a,b)) / (\Sigma ab Wc(a,b)) \tag{42}$$

where a, b are integers satisfying 0<=a<=3 and 0<=b<=3. Σab represents a sum calculated by varying a, b within a range from 0 to 3.

[Math. 43]

$$Wc(a, b) = zc(a, dx00) \cdot zc(b, dy00) \tag{43}$$

[Math. 44]

$$\begin{aligned}zc(0, d) = &\, t \cdot (1 + d) \cdot (1 + d) \cdot (1 + d) - \\ &\, 5 \cdot t \cdot (1 + d) \cdot (1 + d) + \\ &\, 8 \cdot t \cdot (1 + d) - \\ &\, 4 \cdot t\end{aligned} \tag{44}$$

[Math. 45]

$$\begin{aligned}zc(1, d) = &\, (t + 2) \cdot d \cdot d \cdot d - \\ &\, (t + 3) \cdot d \cdot d + 1\end{aligned} \tag{45}$$

[Math. 46]

$$\begin{aligned}zc(2, d) = &\, (t + 2) \cdot (1 - d) \cdot (1 - d) \cdot (1 - d) - \\ &\, (t + 3) \cdot (1 - d) \cdot (1 - d) + 1\end{aligned} \tag{46}$$

[Math. 47]

$$\begin{aligned}zc(3, d) = &\, t \cdot (2 - d) \cdot (2 - d) \cdot (2 - d) - \\ &\, 5 \cdot t \cdot (2 - d) \cdot (2 - d) + \\ &\, 8 \cdot t \cdot (2 - d) - 4 \cdot t,\end{aligned} \tag{47}$$

where t is a real number around −0.5<=t<=−2. A case where t=−1 is most frequently used.

While t=−1 will be adopted in this case, t can also assume other values.

[Math. 48]

$$G(a,b) = G0(x00 - 1 + a, y00 - 1 + b) \tag{48}$$

where G0 denotes an image to be interpolated.

The prescribed interpolation method in mathematical expressions (42) to (48) above is cubic interpolation. As described in the third process above, as advance preparation, a translated image of an assumed migration amount ds is created by interpolating a point deviated by −ds using an interpolation calculation method based on cubic interpolation and a migration amount is measured by the phase restriction correlation method. In a prescribed step, the assumed migration amount is changed and a migration amount measurement table ST1 representing a correspondence between an assumed migration amount and a measured migration amount is created.

Next, based on mathematical expressions (17) to (20) according to the third process, a corrected migration amount table ST2 that determines a correspondence between an actual migration amount and a corrected migration amount is created. Once preparation is completed by the creation of the corrected migration amount table, an interpolation calculation in which an interpolation point has been corrected can be performed as described below. In other words, based on mathematical expressions (21) to (24), a corrected interpolation point $(x00\_h, y00\_h) = (x00+dx00\_h, y00+dy00\_h)$ is determined in a similar manner. By performing an interpolation calculation of the corrected interpolation point $(x00\_h, y00\_h)$ using a cubic interpolation method in which calculation is performed based on mathematical expressions (42) to (48) above, a corrected interpolation value of the interpolation point $(x, y)$ is determined.

Moreover, in the present Example 2, a corrected weight table Tz represented by mathematical expression (49) below can be created and a corrected interpolation value g5 of the interpolation point $(x, y)$ can also be determined based on mathematical expressions (50) to (56) and (44) to (47).

[Math. 49]

$$Tz(c,k)=zc(c,ST2(k*ds)) \quad (49)$$

(where k is an integer satisfying 0<=k<ms, and
(c is an integer satisfying 0<=c<3 and corresponds to a, b)

In mathematical expression (49), ms denotes an integer and a minute migration amount ds satisfies ds=1/ms.

[Math. 50]

$$g5=(\Sigma ab Wch(a,b)\cdot G(a,b))/(\Sigma ab Wch(a,b)) \quad (50)$$

[Math. 51]

$$Wch(a,b)=zh(a,dx00)\cdot zh(b,dy00) \quad (51)$$

[Math. 52]

$$dx00=kdx00\cdot ds+adx00\cdot ds \quad (52)$$

(where kdx00 is an integer satisfying 0<=kdx00<ms, and (dsx00 is a real number satisfying 0<=adx00<1)

[Math. 53]

$$dy00=kdy00\cdot ds+ady00\cdot ds \quad (53)$$

(where kdy00 is an integer satisfying 0<=kdy00<ms, and (dsy00 is a real number satisfying 0<=ady00<1)

[Math. 54]

$$d=kd\cdot ds+ad\cdot ds \quad (54)$$

(where kd is an integer satisfying 0<=kd<ms, and (ds is a real number satisfying 0<=ad<1)

[Math. 55]

$$zh(c,d)=(1-ad)\cdot Tzh(c,kd)+ad\cdot Tzh(c,kd+1) \quad (55)$$

(where c is an integer satisfying 0<=c<3 and corresponds to a, b)

[Math. 56]

$$Tz(c,k)=zc(c,ST2(kd)) \quad (56)$$

(where ST2 denotes a corrected migration amount table)

(3) Example 3

A configuration and an overall procedure of Example 3 are the same as the configuration and the overall procedure of Example 1. A specific interpolation calculation method for performing an interpolation calculation has been described in Examples 1 and 2. In Example 3, a detailed procedure of a processing method by which the computation apparatus 104 creates the distortion map 203 and the distortion-corrected map 204 in step 302 will be described below.

(3-1) Method of Creating Distortion Map 203 (Refer to FIG. 10)

The distortion measurement image 201 is a photograph of the distortion measurement subject 101 which is drawn by lines at regular intervals with equal horizontal and vertical widths and, if there is no distortion, the lines should appear to be at regular intervals with equal horizontal and vertical widths. The presence of distortion causes the image to be distorted accordingly. Subsequently, points where the horizontal and vertical lines intersect become measurement points where distortion is to be measured. At a measurement point, an actual coordinate value can be obtained by observing shading of the lines and estimating a center.

Line intervals of the distortion measurement image 201 are measured at a plurality of locations over the entire image and an average of the line intervals is calculated to determine an average line interval. Subsequently, a reference image 202 in which horizontal and vertical lines are depicted at regular intervals and which is free of distortion is created so that widths between the lines match the average line interval. Points where the horizontal and vertical lines intersect become measurement points where distortion is to be measured. While lines also have thickness on an image, by observing shading of the lines and estimating a center thereof, an actual coordinate value of a reference point can be obtained.

A measurement point that is nearest to an image center of the distortion measurement image 201 corresponds to a reference point that is nearest to an image center of the reference image 202 that is free of distortion. Starting with the corresponding measurement point near the center described above and the reference point, correspondence between other reference points and measurement points can be determined by searching a periphery in an order of up, down, left, and right.

An associated reference point is to migrate to a measurement point due to distortion. A migration amount by which a reference point migrates to a measurement point can be determined from a difference in coordinates between the two points and the distortion map 203 corresponds to a migration amount as viewed from a measurement point. However, since a measurement point generally has a real coordinate, the migration amount cannot be directly described on the distortion map 203 and a value of each point on the distortion map 203 is determined by interpolation from values of migration amounts of four measurement points that enclose the point. If coordinates of the four measurement points are denoted by (x1, y1), (x2, y2), (x3, y3), and (x4, y4), values of migration amounts of the respective points are denoted by (dx1, dy1), (dx2, dy2), (dx3, dy3), and (dx4, dy4), and a coordinate of an interpolation point is denoted by (x, y), then a value (dx, dy) of the distortion map at the interpolation point can be calculated by mathematical expressions (57) and (58) below.

[Math. 57]

$$dx=dx1*(x2-x)/(x2-x1)+dx2*(x-x1)/(x2-x1) \quad (57)$$

[Math. 58]

$$dy=dy1*(y2-y)/(y-2y1)+dy2*(y-y1)/(y2-y1) \quad (58)$$

The interpolation represented by mathematical expressions (57) and (58) above is performed for all pixels (points) on the distortion map 203 and the determined migration amounts are adopted as values of the pixels (points) on the distortion map 203. Moreover, when an interpolation point at an edge of the image does not have four measurement points enclosing the interpolation point, an interpolation value can also be calculated according to mathematical expressions (57) and (58) above using four measurement points nearest to the interpolation point.

When an interpolation point does not have four measurement points enclosing the interpolation point, a distortion range map can be defined instead of defining value of the distortion map 203, whereby a value of the distortion range map at the location is set to 0 which indicates that a value on the distortion map cannot be defined and values of the distortion range map are set to 1 at other locations where a value on the distortion map 203 can be defined. Accordingly, since portions where the value of the distortion correction range map is 0 can be recognized as locations where a value of the distortion map 203 is not defined, the portions can be prevented from being used in subsequent processes.

In addition, while an average value of line intervals has been determined in the description given above by calculating an average of line intervals as measured at a plurality of locations of the distortion measurement image 201, an average value of line intervals can also be determined using other calculation methods. For example, an average line interval can be calculated by dividing a width of an entire image by the number of lines. More specifically, the number nx of lines that appear without missing portions thereof at left and right ends among lines in a vertical direction is counted, the number ny of lines that appear without missing portions thereof at upper and lower ends among lines in a horizontal direction is counted, and when the number of horizontal pixels of the image is denoted by wx and the number of vertical pixels of the image is denoted by wy, whichever value is larger among (wx−1)/(nx−1)(wy−1)/(ny−1) is set as wd. By drawing lines from both ends of the reference image 202 that is free of distortion at intervals of wd, reference points can be reliably associated with measurement points.

Furthermore, while the reference image 202 is created and reference points that are intersections of lines are determined in the description given above, coordinates of reference points can be determined without actually creating the reference image 202. For example, assuming that the reference image 202 is virtually created, a coordinate of a reference point at that time can be determined by calculation.

In a similar manner to the processes described above, the distortion-corrected map 204 can also be directly determined from a measurement value by considering the correspondence between the two from an opposite perspective.

(3-2) Method of Creating Distortion-Corrected Map 204 from Distortion Map 203

Figure 16:
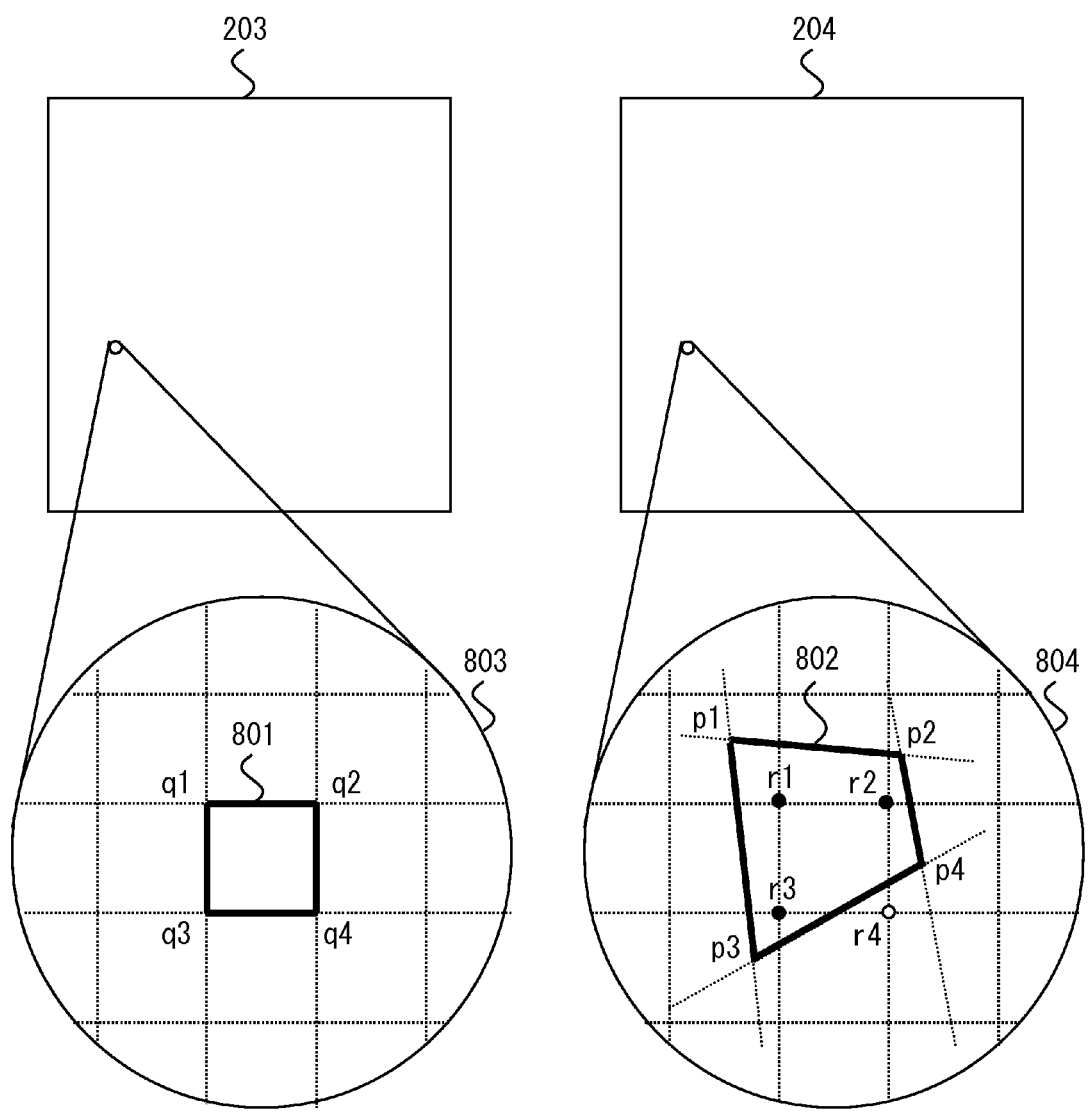
FIG. 16 shows an enlarged view 803 of a square 801 having four adjacent points of interest as apexes and a periphery of the square 801 on the distortion map 203, and an enlarged view of a square 802 having four points created by distortion of the four points of interest as apexes, an interior point having an integer coordinate value, and a periphery of the square 802 on the distortion-corrected map 204.
Figure 17:
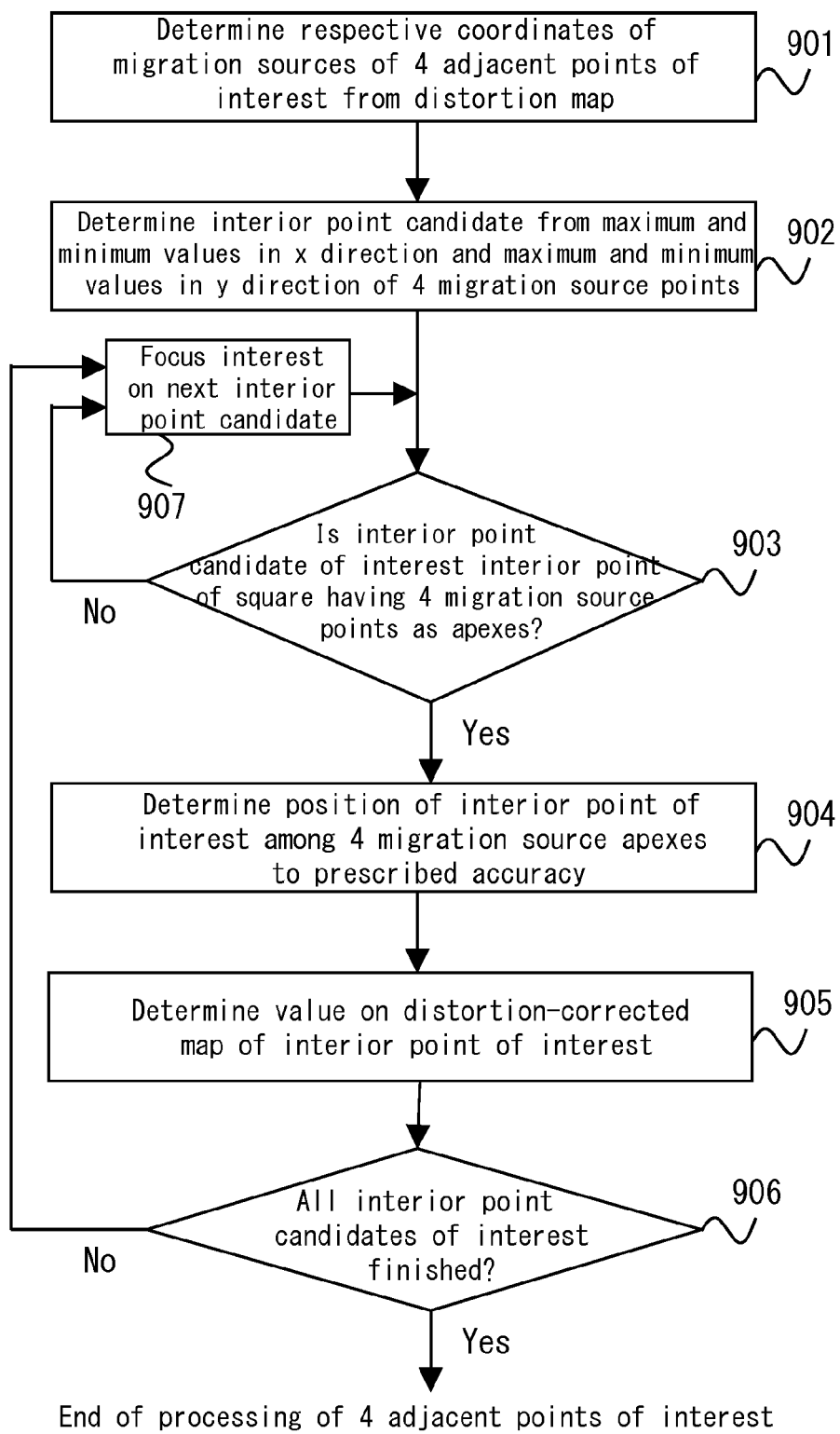
FIG. 17 is a flow chart showing a procedure for creating the distortion-corrected map 204 from the distortion map 203.
Figure 18:
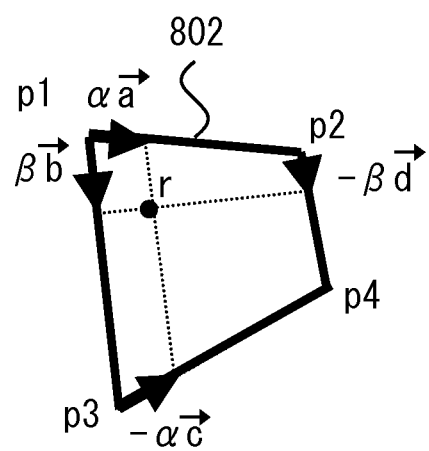
FIG. 18 is a diagram showing how a position of an interior point of the square 802 on the distortion-corrected map 204 is expressed as a proportion α, β of distances from points on both sides of the distortion-corrected map 204.

FIG. 17 is a flow chart showing a procedure for creating the distortion-corrected map 204 from the distortion map 203. In addition, FIG. 16 shows an enlarged view 803 of a square 801 having four adjacent points of interest as apexes and a periphery of the square 801 on the distortion map 203, and an enlarged view of a square 802 having four points created by distortion of the four points of interest as apexes, an interior point having an integer coordinate value, and a periphery of the square 802 on the distortion-corrected map 204. FIG. 18 is a diagram showing how a position of an interior point of the square 802 on the distortion-corrected map 204 is expressed as a proportion α, β of distances from points on both sides of the distortion-corrected map 204. The respective steps in FIG. 17 will now be described.

Step 901: For four adjacent points of interest q1, q2, q3, and q4 in the distortion map 203, respectively reference values of the distortion map 203 and calculate coordinates p1, p2, p3, and p4 of migration sources of the four points prior to migration by the distortion. For example, if a coordinate of point q1 is denoted by (q1x, q1y) and a value on the distortion map 203 of the point q1 is denoted by (dq1x, dq1y), then a coordinate of a migration source prior to migration due to the distortion is expressed as (q1x−dq1x, q1y−dq1y). FIG. 16 illustrates an example of four adjacent points of interest and the square 801 having the four adjacent points as apexes using an enlarged view 803 of a periphery of the square 801 among the distortion map 203. In addition, FIG. 16 also illustrates an enlarged view 804 showing four points that are migration sources of the four points of interest prior to migration by distortion, the square 802 formed by the four migration source points, and peripheral positions including an interior point of the square 802 in the distortion-corrected map 204.

Step 902: Adopt, as an interior point candidate, an integer coordinate value that falls in a square enclosed by a maximum value and a minimum value in an x direction and a maximum value and a minimum value in a y direction among coordinates of the four migration source points. An integer coordinate value is included as an interior point candidate within the square even when located on a side of the square. FIG. 16 illustrates a case where four points r1, r2, r3, and r4 are interior point candidates.

Step 903: Determine whether or not an interior point candidate of interest is an interior point of the square 802 formed by the four migration source apexes. In the case of FIG. 16, an interior point of interest among the interior point candidates r1, r2, r3, and r4 is denoted by r. It is assumed that the interior point candidate of interest r starts at r1 and sequentially changes to r2, r3, and r4.

A calculation method for determining whether the interior point candidate of interest r is an interior point of the square 802 is as shown in the fourth process described above. In other words, α1, β1, α2, and β2 are calculated based on mathematical expressions (25) to (28), and a determination of an interior point including the sides is made when all of these values are equal to or larger than 0. In case of an interior point, the process advances to step 904, and if not, the process advances to step 907.

Step 904: When the interior point candidate of interest r is an interior point of the square 802, determine values of α, β to a prescribed accuracy when a position of the interior point among the square 802 is expressed as proportions α, β from coordinate positions of the four apexes of the square 802.

FIG. 18 shows a relationship between the square 802 and α, β. A vector a denotes a vector (p2−p1), a vector b denotes a vector (p3−p1), a vector c denotes a vector (p3−p4), and a vector d denotes a vector (p2−p4).

The fourth process described above shows how to perform iterations for determining α, β to a prescribed accuracy. In other words, each amount is calculated based on mathematical expressions (29) to (41), and the calculations are repeated until a calculation error e(k) as calculated according to mathematical expression (33) equals a prescribed value.

Step 905: Calculate a value of the distortion-corrected map 204 of the interior point of interest. Since a, p determined in step 904 signify that a coordinate (rx, ry) of the interior point of interest r migrates to (q1x$_+$α, q1y+β) due to distortion, a migration amount (q1x+α−rx, q1y+β−ry) in this case becomes a value of the point r on the distortion-corrected map 204.

Step 906: Determine whether processing of all interior point candidates of interest has been completed. In the case of FIG. 16, a determination is made on whether processing of interior points of interest starting from r1 has also been performed for r2, r3, and r4. If processing of all interior point candidates has not been completed, the process advances to step 907. If processing of all interior point candidates has been completed, processing of four adjacent points of interest on the distortion map 203 is finished.

Step 907: Set next interior point as interior point of interest. In the case of FIG. 16, when the interior point of interest is r2, r3 that is next is set as the interior point of interest.

According to steps 901 to 907 described above, processing of the four adjacent points of interest on the distortion-corrected map 204 is finished. The distortion-corrected map 204 is created by performing the process described above on four adjacent points of all combinations in this manner. A point on the distortion-corrected map 204 to which a value is not assigned by the process described above signifies that the point migrates to outside a field of view of the photographed image 401 due to distortion. By setting a value of the distortion correction range map 205 to 0 for locations where a migration to the outside of the field of view is known and setting a value of the correction range map 205 to 1 for locations where a migration ends inside of the field of view, reference to outside of the field of view can be prevented in subsequent processes.

Moreover, among steps 901 to 907 described above, when creating a corrected distortion map from a distortion map that represents distortion of an image, step 901 can be regarded as executing an original coordinate calculation process for respectively referencing a value of the distortion map with respect to four adjacent points of interest on the distortion map and calculating coordinates of migration sources of the four points prior to migration due to the distortion, step 902 can be regarded as executing an interior point candidate calculation process for adopting, as an interior point candidate, an integer coordinate value within a square that is enclosed by a maximum value and a minimum value in an x direction and a maximum value and a minimum value in a y direction among coordinates of the four migration source points, step 903 can be regarded as executing an interior point determination process for determining whether an interior point candidate of interest is an interior point of a square that is formed by the four migration source apexes including sides thereof, step 904 can be regarded as executing a proportional position calculation process for determining, when the interior point candidate of interest is an interior point of a square that is formed by the four migration source apexes, a proportion that indicates a position where the interior point is located in the square; and step 905 can be regarded as executing a distortion-corrected value calculation process for calculating a migration value of the interior point of interest based on the proportion of the interior point position as calculated in the proportional position calculation process and adopting the migration value as a value of the interior point on the distortion-corrected map.

(3-3) Other Related Matters

In the description given above, (3-1) shows how a distortion map 203 is created and (3-2) shows how a distortion-corrected map is created from the distortion map 203. While the distortion map 203 is created based on a correspondence between a measurement point and a reference point, the distortion-corrected map 204 can be directly determined by considering the correspondence from an opposite perspective. However, when both the distortion map 203 and the distortion-corrected map 204 are directly determined based on measurement, since correspondence of a general point is determined by interpolation, interpolation errors differ between the two. In other words, unlike the distortion-corrected map 204 that is directly determined based on measurement, the distortion-corrected map 204 created according to the method described in (3-2) above from the distortion map 203 contains different measurement errors. When the distortion map 203 is determined by calculation according to a method similar to that described in (3-2) above using the distortion-corrected map 204 created according to the method described in (3-2), an error is limited to an extremely small value representing a difference in calculation errors, which is approximately the same as the original measured distortion map 203. However, when the distortion map 203 is determined according to a method similar to that described in (3-2) above from a directly measured distortion-corrected map 204, a difference in measurement errors from the distortion map 203 determined by measurement is created and results in an error value that is greater than a calculation error.

For the reasons described above, favorably, one of the distortion map 203 and the distortion-corrected map 204 is measured by measurement and the other map is determined by calculation based on the measured map.

While the distortion map 203 is determined by measurement as described in (3-1) in the description above, alternatively, a migration amount may be artificially determined and adopted as a value of the distortion map 203.

(4) Example 4

Examples 1, 2, and 3 illustrate a system where the computation apparatus 104 performs image processing on an image photographed by the digital camera 102 as shown in FIG. 9. However, the present invention can be applied to systems with various configurations. For example, the present invention can also be applied to a system that performs measurement or inspections by photographing an image. In this case, a computation apparatus of the system is to execute image processing including characteristics of the present invention.

In Example 4, a semiconductor measurement apparatus will be illustrated which performs visual inspection of a semiconductor wafer or the like by photographing an image. A computation apparatus included in the semiconductor measurement apparatus performs image processing including characteristics of the present invention.

Figure 19:
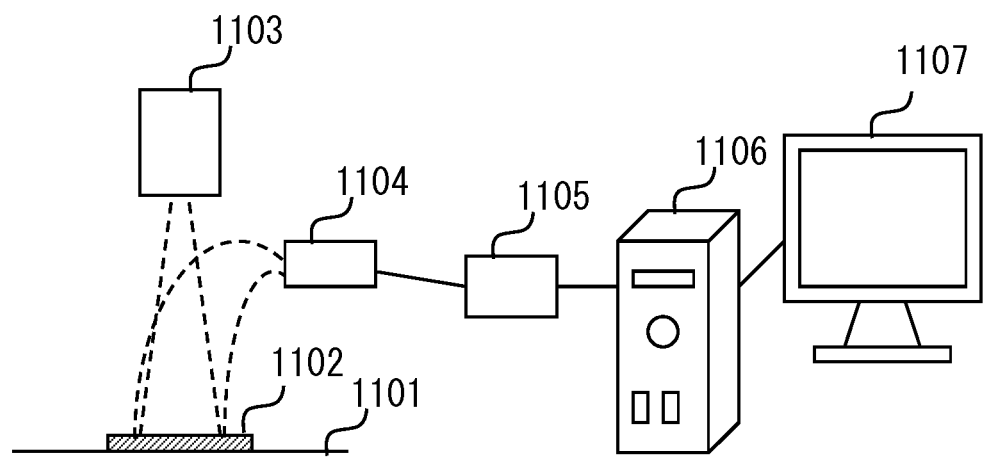
FIG. 19 is a block diagram of a semiconductor measurement apparatus according to Example 4.

FIG. 19 is a block diagram of a semiconductor measurement apparatus according to Example 4. The semiconductor measurement apparatus configured as shown in FIG. 19 has a stage 1101. On the stage 101, a partially manufactured semiconductor on which a resist is mounted is carried into a photographing field of view as a photographic target 1102. Subsequently, a prescribed area of the photographic target 1102 is scanned by electrons fired from an electron gun 1103. Accordingly, secondary electrons released from the photographic target 1102 are captured by a secondary electron detection unit 1104, whereby a state of the captured secondary electrons is converted into image data of the photographed image by an imaging unit 1105.

The stage 1101, the electron gun 1103, the secondary electron detection unit 1104, and the imaging unit 1105 constitute a photographic apparatus. In order to obtain a photographed image, the imaging unit 1105 sends control signals to the stage 1101, the electron gun 1103, and the secondary electron detection unit 1104 for respectively operating the units, sequentially and appropriately positions signals detected by the secondary electron detection unit 1104, and generates image data.

A computation apparatus 1106 receives image data of the photographed image created by the imaging unit 1105, subjects the image data to prescribed image processing, and causes a display apparatus 1107 to display a result of the image processing. The computation apparatus 1106 may be built-in the semiconductor measurement apparatus or may be provided externally. The computation apparatus 1106 can also be configured so as to execute processes of the present invention in a similar manner to the computation apparatus 104 shown in FIG. 9.

In this case, by using a semiconductor provided with a pattern including a plurality of fine lines drawn horizontally and vertically as the photographic target 1102, the photographic target 1102 is able to perform a similar role to the distortion measurement subject 101 shown in FIG. 9. Accordingly, the computation apparatus 1106 according to the present example can also create the distortion map 203 and further create the distortion-corrected map 204 in a similar manner to the computation apparatus 104 according to Examples 1 to 3.

Subsequently, by photographing an ordinary semiconductor as the photographic target 1102 to obtain a photographed image 401 and having the computation apparatus 1106 perform image processing similar to that described in Examples 1 to 3 on the photographed image 401, a corrected image 402 can be obtained.

As described above, the image processing according to the present invention can be incorporated and executed in apparatuses having various objectives. The embodiments and examples of the present invention described above merely represent examples for illustrating the present invention, and it is to be understood that the scope of the present invention is not limited to the embodiments and examples. It will be obvious to those skilled in the art that the present invention can be implemented in various other modes without departing from the spirit of the present invention.

The invention claimed is:

1. An image processing apparatus comprising a processor and a non-transitory computer readable medium storing instructions which when executed by the processor, cause the processor to:
retain data created by subjecting one-dimensional data of a prescribed length to Fourier transform, as reference data;
acquire an interpolation process image of a prescribed size which includes an interpolation point of an inputted image;
create a weighted image of a same size as the interpolation process image by determining a reference position on the basis of a distance between the interpolation point and a desired integer coordinate position in a vicinity of the interpolation point and acquiring data from the reference position of the reference data; and
adopt a product sum of the interpolation process image and the weighted image as an interpolation value of the interpolation point.

2. A semiconductor measurement apparatus comprising:
a photographic apparatus for photographing an image of a semiconductor; and
the image processing apparatus according to claim 1 wherein the instructions, when executed by the processor, further cause the processor to use the image photographed by the photographic apparatus as an inputted image.

3. An image processing apparatus comprising a processor and a non-transitory computer readable medium storing instructions which, when executed by the processor, cause the processor to:
calculate an interpolation value of an interpolation point of an inputted image based on a prescribed interpolation method which uses a distance between the interpolation point and an integer coordinate position in a vicinity of the interpolation point as a parameter value;
create a translated image by defining an interpolation point by configuring a desired assumed migration amount as a parameter value for calculating the interpolation value and by performing an interpolation process on the inputted image;
measure a measured migration amount from the inputted image with respect to the created translated image;
determine correspondence information that enables obtaining a corrected migration amount to be configured as the parameter value in order to obtain an interpolation value of an interpolation point of an actual migration amount, from the actual migration amount on the basis of a relationship between the assumed migration amount and the measured migration amount measured with respect to the translated image; and
determine, based on the correspondence information, a corrected migration amount obtained when a distance between an interpolation point of the inputted image and an integer coordinate position in a vicinity of the interpolation point is adopted as an actual migration amount, and performing an interpolation process on the inputted image by configuring the corrected migration amount as a parameter value and by using the interpolation method.

4. The image processing apparatus according to claim 3, wherein the instructions, when executed by the processor, further cause the processor to:
configure a plurality of prescribed values as an assumed migration amount for creating respective translated images, and
measure an actual migration amount for each of the translated images in order to determine a first correspondence from an assumed migration amount to a measured migration amount;
calcualte a second correspondence from a measured migration amount to an assumed migration amount on the basis of the first correspondence; and
adopt, as the measured migration amount, a distance between an interpolation point of the inputted image and an integer coordinate position in a vicinity of the interpolation point;

determine an assumed migration amount corresponding to the measured migration amount on the basis of the second correspondence, and adopt the assumed migration amount as the corrected migration amount to be configured as a parameter value.

5. The image processing apparatus according to claim 3, wherein the instructions, when executed by the processor, further cause the processor to:

acquire an interpolation process image of a prescribed size which includes an interpolation point of an inputted image;

subject the interpolation process image to Fourier transform;

change, based on a shift theorem, a phase of each value of the transformed interpolation process image which has been subjected to Fourier transform, such that the interpolation point migrates to a desired nearby integer coordinate position;

subject the interpolation process image whose phase has been changed to inverse Fourier transform; and adopt, as an interpolation value of the interpolation point, a value of a pixel at the integer coordinate position, from the transformed interpolation process image which has been subjected to inverse Fourier transform.

6. The image processing apparatus according to claim 3, wherein the instructions, when executed by the processor, further cause the processor to:

retain data created by subjecting one-dimensional data of a prescribed length to Fourier transform, as reference data;

acquire an interpolation process image of a prescribed size which includes an interpolation point of an inputted image;

create a weighted image of a same size as the interpolation process image by determining a reference position on the basis of a distance between the interpolation point and a desired integer coordinate position in a vicinity of the interpolation point and acquiring data from the reference position of the reference data; and adopt a product sum of the interpolation process image and the weighted image as an interpolation value of the interpolation point.

7. The image processing apparatus according to claim 3, wherein the instructions, when executed by the processor, further cause the processor to perform the interpolation process using cubic interpolation.

8. A semiconductor measurement apparatus comprising:
a photographic apparatus for photographing an image of a semiconductor; and
the image processing apparatus according to claim 3, wherein the instructions, when executed by the processor, further cause the processor to:
with respect to a plurality of assumed migration amounts, create a translated image resulting from translating an inputted image photographed by the photographic apparatus by the migration amount using an interpolation process which adopts the plurality of migration amounts as a parameter value;

measure a migration amount from the inputted image with respect to a plurality of the created translated images;

determine correspondence information, which associates an actual migration amount with a corrected migration amount to be configured as a parameter value in order to obtain an interpolation value of an interpolation point of the actual migration amount, based on a relationship between the assumed migration amount and the measured migration amount with respect to the plurality of created translated images; and configure a corrected migration amount whose corresponding actual migration amount in the correspondence information is a migration amount from an integer coordinate position in a vicinity of an interpolation point for which interpolation has been requested as a parameter value in order to determine a corrected interpolation value of the interpolation point.

9. A distortion-corrected map creation apparatus for performing a process of creating a distortion-corrected map from a distortion map, the distortion map being a map showing a point from which each point on a distorted image had originally migrated due to the distortion, and the distortion-corrected map being a map showing where each point on an image without the distortion migrates due to the distortion, the distortion-corrected map creation apparatus comprising a processor and a non-transitory computer readable medium storing instructions which, when executed by the processor, cause the processor to:

reference a value of the distortion map with respect to four adjacent points of interest on the distortion map and calculating coordinates of migration sources of the four points prior to migration due to the distortion;

adopt, as an interior point candidate, an integer coordinate value within a first square that is enclosed by a maximum value and a minimum value in an x direction and a maximum value and a minimum value in a y direction among coordinates of the four migration source points;

determine the interior point candidate as an interior point when the interior point candidate is inside or on a side of a quadrilateral that is formed by the four migration source points;

calculate and determine, with respect to the interior point, a proportional position of the interior point in the quadrilateral to a prescribed accuracy; and calculate a value of the distortion-corrected map at the interior point position on the basis of the proportional position.

* * * * *